(12) United States Patent
Ogasawara et al.

(10) Patent No.: US 9,343,266 B2
(45) Date of Patent: May 17, 2016

(54) CHARGED PARTICLE BEAM PATTERN WRITING METHOD AND CHARGED PARTICLE BEAM WRITING APPARATUS THAT CORRECTS BEAM ROTATION UTILIZING A CORRELATION TABLE

(71) Applicant: NuFlare Technology, Inc., Numazu-shi (JP)

(72) Inventors: Munehiro Ogasawara, Kanagawa (JP); Takanao Touya, Kanagawa (JP); Shuichi Tamamushi, Seoul (KR)

(73) Assignee: NuFlare Technology, Inc., Numazu-shi (JP)

( * ) Notice: Subject to any disclaimer, the term of this patent is extended or adjusted under 35 U.S.C. 154(b) by 194 days.

(21) Appl. No.: 13/950,466

(22) Filed: Jul. 25, 2013

(65) Prior Publication Data

US 2014/0061499 A1 Mar. 6, 2014

(30) Foreign Application Priority Data

Aug. 30, 2012 (JP) ................................ 2012-190173

(51) Int. Cl.
*H01J 37/317* (2006.01)
*H01J 37/145* (2006.01)
(Continued)

(52) U.S. Cl.
CPC ............. *H01J 37/3174* (2013.01); *B82Y 10/00* (2013.01); *B82Y 40/00* (2013.01); *H01J 37/145* (2013.01); *H01J 37/3045* (2013.01); *H01J 2237/31774* (2013.01)

(58) Field of Classification Search
CPC ................ H01J 37/145; H01J 37/3174; H01J 2237/31774
See application file for complete search history.

(56) References Cited

U.S. PATENT DOCUMENTS 5,864,142 A 1/1999 Muraki et al.
6,011,268 A 1/2000 Nakasuji
(Continued)

FOREIGN PATENT DOCUMENTS

CN 1607640 A 4/2005
JP 9-330867 12/1997
(Continued)

OTHER PUBLICATIONS

Combined Taiwanese Office Action and Search Report issued Aug. 8, 2014, in Taiwanese Patent Application No. 102126903 with English translation.
(Continued)

*Primary Examiner* — Robert Kim
*Assistant Examiner* — Sean Luck
(74) *Attorney, Agent, or Firm* — Oblon, McClelland, Maier & Neustadt, L.L.P.

(57) ABSTRACT

A charged particle beam pattern writing method according to an embodiment, includes measuring a position displacement amount of a stage above which a target object is placed, in a rotation direction; and writing a pattern of a beam image on the target object above the stage while the beam image is rotated, by using a plurality of electrostatic lenses at least one of which is arranged in a magnetic field of each of the plurality of electromagnetic lenses whose magnetic fields are in opposite directions, to avoid a focus displacement of a charged particle beam passing through the plurality of electromagnetic lenses and to correct the position displacement amount measured, in the rotation direction of the stage.

14 Claims, 18 Drawing Sheets

(51) Int. Cl.
*H01J 37/304* (2006.01)
*B82Y 10/00* (2011.01)
*B82Y 40/00* (2011.01)

(56) References Cited

U.S. PATENT DOCUMENTS

| | | | |
|---|---|---|---|
| 6,376,137 | B1 | 4/2002 | Okino |
| 7,041,988 | B2 | 5/2006 | Hamaguchi et al. |
| 7,560,713 | B2 | 7/2009 | Doering et al. |
| 7,807,988 | B2 * | 10/2010 | Usa et al. .................. 250/492.3 |
| 2004/0041101 | A1 * | 3/2004 | Akutsu ..................... 250/491.1 |
| 2006/0169927 | A1 * | 8/2006 | Muraki et al. ........... 250/492.23 |
| 2009/0057571 | A1 * | 3/2009 | Goto ........................... 250/492.3 |
| 2009/0173887 | A1 * | 7/2009 | Ito et al. ................. 250/396 ML |
| 2010/0294955 | A1 * | 11/2010 | Wang et al. ................. 250/492.3 |
| 2011/0253892 | A1 * | 10/2011 | Yamaguchi ................... 250/307 |
| 2013/0240750 | A1 | 9/2013 | Touya et al. |

FOREIGN PATENT DOCUMENTS

| | | |
|---|---|---|
| JP | 11-54412 | 2/1999 |
| JP | 2000-357647 A | 12/2000 |
| JP | 2003-332207 | 11/2003 |
| JP | 2006-261342 | 9/2006 |
| JP | 2007-534121 | 11/2007 |
| JP | 2010-72180 A | 4/2010 |

OTHER PUBLICATIONS

U.S. Appl. No. 14/108,936, filed Dec. 17, 2013, Touya, et al.
U.S. Appl. No. 14/108,844, filed Dec. 17, 2013, Touya, et al.
Korean Office Action issued Jun. 27, 2014 in Patent Application No. 10-2013-0101671 with English Translation.

* cited by examiner

CHARGED PARTICLE BEAM PATTERN WRITING METHOD AND CHARGED PARTICLE BEAM WRITING APPARATUS THAT CORRECTS BEAM ROTATION UTILIZING A CORRELATION TABLE

CROSS-REFERENCE TO RELATED APPLICATION

This application is based upon and claims the benefit of priority from prior Japanese Patent Application No. 2012-190173 filed on Aug. 30, 2012 in Japan, the entire contents of which are incorporated herein by reference.

BACKGROUND OF THE INVENTION

1. Field of the Invention

Embodiments described herein relate generally to a charged particle beam pattern writing method and a charged particle beam writing apparatus and, for example, relates to a technique for writing a pattern by irradiating a target object above a stage with a beam.

2. Related Art

A lithography technique which leads development of micropatterning of a semiconductor device is a very important process for exclusively generating a pattern in semiconductor manufacturing processes. In recent years, with an increase in integration density of an LSI, a circuit linewidth required for semiconductor devices is getting smaller year by year. The electron beam pattern writing technology has inherently superior resolving power and is used to write a pattern to a wafer or the like by using an electron beam.

For example, a writing apparatus using multiple beams is known. When compared with a case in which a pattern is written using an electron beam, many beams can be irradiated at a time by using multiple beams and throughput can significantly be improved. In such a multi-beam writing apparatus, for example, a multi-beam is formed from an electron beam emitted from an electron gun assembly through a mask having a plurality of holes and each beam is blanking-controlled before a desired position on a target object being irradiated with each unshielded beam (see Japanese Patent Application Laid-Open No. 2006-261392, for example).

In an electron beam writing apparatus, a target object is placed above a stage and a pattern is written on the target object while moving the stage or performing a step and repeat operation. In this case, a pattern is written by focusing on the target object surface in the end while refracting a beam of each shot by an optical system such as an electromagnetic lens. However, even if focused by the optical system, a pattern cannot be written to a desired position if the stage position is displaced. This is, for example, a case when a rotational position displacement of the stage arises. Such a problem causes degradation in precision of the pattern writing position. In a single beam system, the number of beams is one and an X/Y directional displacement and a rotational displacement arise for one shot when a rotational position displacement of the stage arises and thus, a position error is in most cases not so great compared with a multi-beam system. In contrast to the single beam system, however, many beams are emitted simultaneously in one shot in the multi-beam system and thus, if a rotational position displacement of the stage arises, a rotational displacement arises in the whole multiple beams and a pattern writing position error could become intolerable. Thus, reducing such a rotational position displacement of the stage as much as possible is demanded. However, it is difficult to completely eliminate installation errors of the stage or rotational errors caused by a stage drive system. Such a problem is expected to grow while pattern writing precision is further sought in the future even in the single beam system.

BRIEF SUMMARY OF THE INVENTION

In accordance with one aspect of this invention, a charged particle beam pattern writing method includes:
measuring a position displacement amount of a stage above which a target object is placed, in a rotation direction; and
writing a pattern of a beam image on the target object above the stage while the beam image is rotated, by using a plurality of electrostatic lenses at least one of which is arranged in a magnetic field of each of the plurality of electromagnetic lenses whose magnetic fields are in opposite directions, to avoid a focus displacement of a charged particle beam passing through the plurality of electromagnetic lenses and to correct the position displacement amount measured, in the rotation direction of the stage.

In accordance with another aspect of this invention, a charged particle beam writing apparatus, includes:
a stage above which a target object is placed;
a measuring unit configured to measure a position displacement amount of the stage in a rotation direction;
a plurality of electromagnetic lenses whose magnetic fields are in opposite directions;
a plurality of electrostatic lenses at least one of which is arranged in a magnetic field of each of the electromagnetic lenses; and
a plurality of voltage application units configured to apply voltages to the plurality of electrostatic lenses as a set of voltages to rotate a beam image to avoid a focus displacement of a charged particle beam passing through the plurality of electromagnetic lenses and to correct the position displacement amount measured, in the rotation direction of the stage,
wherein a pattern of the beam image rotated is written on a target object above the stage.

DETAILED DESCRIPTION OF THE INVENTION

In the following embodiments, writing apparatuses and methods of writing a pattern capable of writing a pattern in a desired position even if rotational errors of the stage arise will be described.

Also in the following embodiments, a configuration using an electron beam as an example of a charged particle beam will be described. However, the charged particle beam is not limited to an electron beam, and a beam such as an ion beam using charged particles may also be used.

Embodiment 1

Figure 1:
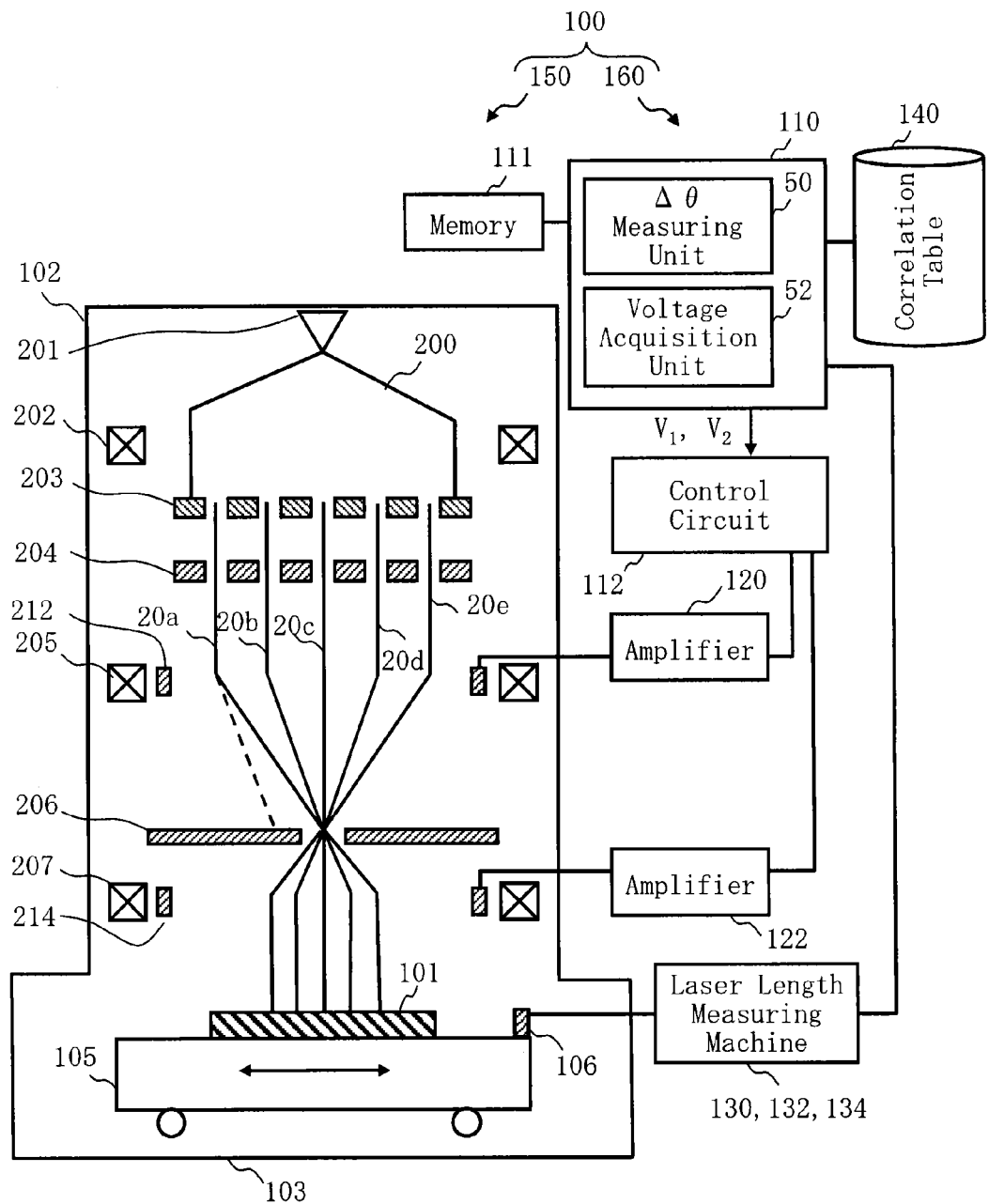
FIG. 1 is a conceptual diagram showing the configuration of a writing apparatus according to Embodiment 1.

FIG. 1 is a conceptual diagram showing the configuration of a writing apparatus according to Embodiment 1. In FIG. 1, a writing apparatus 100 includes a pattern generator 150 and a controller 160. The writing apparatus 100 is an example of a multi-charged particle beam writing apparatus. The pattern generator 150 includes an electron lens barrel 102 and a pattern writing chamber 103. In the electron lens barrel 102, an electron gun assembly 201, an illumination lens 202, an aperture plate member 203, a blanking plate 204, a reducing lens 205, a limited aperture plate member 206, an objective lens 207, and electrostatic lenses in two stages are arranged. An XY stage 105 is arranged inside the pattern writing chamber 103. A target object 101 such as a mask to be a substrate on which a pattern should be written is arranged above or "on" the XY stage 105 while a pattern is written. The target object 101 includes an exposure mask used for fabricating a semiconductor device or a semiconductor substrate (silicon wafer) on which a semiconductor device is fabricated. The target object 101 also includes mask blanks to which a resist is applied and on which no pattern is written. A mirror 106 for laser length measurement is arranged above the XY stage 105.

The reducing lens 205 and the objective lens 207 are both configured by an electromagnetic lens and arranged in such a way that magnetic fields are in opposite directions and excitation thereof is equal in magnitude. An electrostatic lens 212 is arranged in a magnetic field of the reducing lens 205. An electrostatic lens 214 is arranged in a magnetic field of the objective lens 207. The electrostatic lens 212 is suitably arranged in a position completely included in a magnetic field of the reducing lens 205 so that an influence of a magnetic field generated by a voltage applied to the electrostatic lens 212 efficiently acts on the magnetic field of the reducing lens 205. Similarly, the electrostatic lens 214 is suitably arranged in a position completely included in a magnetic field of the objective lens 207 so that an influence of a magnetic field generated by a voltage applied to the electrostatic lens 214 efficiently acts on the magnetic field of the objective lens 207.

The controller 160 includes a control computer 110, a memory 111, a control circuit 112, amplifiers 120, 122, a storage device 140 such as magnetic disk drive, and laser length measuring machines 130, 132, 134. The control computer 110, a memory 111, the control circuit 112, the amplifiers 120, 122 (voltage application units), the storage device 140, and the laser length measuring machines 130, 132, 134 are mutually connected via a bus.

A rotational error measuring unit 50 and a voltage acquisition unit 52 are arranged inside the control computer 110. The function such as the rotational error measuring unit 50 or the voltage acquisition unit 52 may be configured by hardware such as an electric circuit or by software such as a program executing these functions. Alternatively, the function may be configured by a combination of hardware and software. Information input into or output from the rotational error measuring unit 50 and the voltage acquisition unit 52 and information during operation are stored in the memory 111 each time.

Here, in FIG. 1, only the configuration needed to describe Embodiment 1 is shown. The writing apparatus 100 may include other normally needed configurations. FIG. 1 shows a configuration in which one electrostatic lens is arranged in a magnetic field of each electromagnetic lens of the reducing lens 205 and the objective lens 207 whose magnetic fields are in opposite directions, but the present embodiment is not limited to the above configuration. It is only necessary that at least one electrostatic lens be arranged in a magnetic field of each electromagnetic lens whose magnetic field is in opposite directions. Thus, two electrostatic lenses or more may be arranged in a magnetic field of one electromagnetic lens. In FIG. 1, the reducing lens 205 and the objective lens 207 have different magnifications of n:1, but the magnifications may be n:1 (n>1:n may be an integer or a non-integer) or 1:1 for a pair of electromagnetic lenses whose excitation is equal in magnitude and whose magnetic fields are in opposite directions.

Figure 2A:
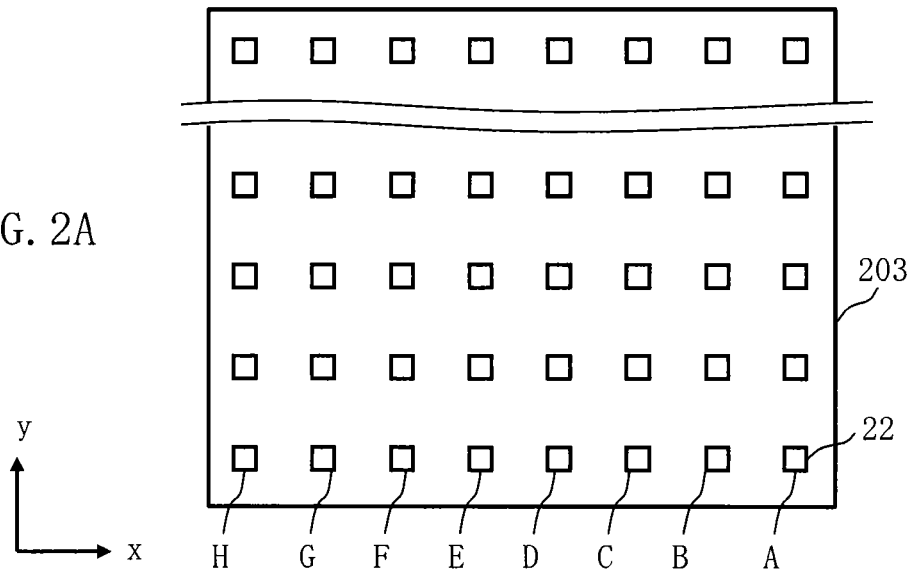
FIGS. 2A and 2B are conceptual diagrams showing the configuration of an aperture plate member according to Embodiment 1.
Figure 2B:
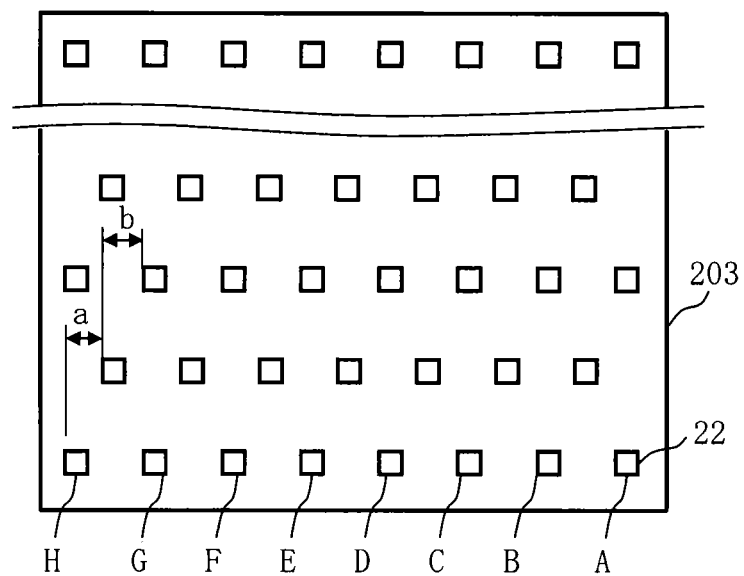

FIGS. 2A and 2B are conceptual diagrams showing the configuration of an aperture plate member according to Embodiment 1. In FIG. 2A, holes (openings) 22 of m rows long (Y direction)×n rows wide (X direction) (m, n≥2) are formed with a predetermined arrangement pitch in the aperture plate member 203 like a matrix. In FIG. 2A, for example, the holes 22 of 512×8 rows are formed. Each of the holes 22 is formed as a rectangle of the same dimensional shape. Alternatively, each of the holes 22 may be a circle of the same outside diameter. Here, an example in which the eight holes 22 of A to H are formed in the X direction for each row in the Y direction is shown. Multiple beams 20 are formed by each of a plurality of the holes 22 being passed by a portion of an electron beam 200. An example in which the holes 22 of two rows or more are arranged both length and width directions (X, Y directions) is shown here, but the arrangement is not limited to the above example. For example, one of the length and width directions (X, Y directions) may have a plurality of rows and the other direction may have only one row. The method of arranging the holes 22 is not limited to a case in which, as shown in FIG. 2A, the holes 22 are arranged in the length and width directions like a grid. For example, as shown in FIG. 2B, holes in the first row and the second row in the length direction (Y direction) may be arranged by being displaced in the width direction (X direction) by a dimension a. Similarly, holes in the second row and the third row in the length direction (Y direction) may be arranged by being displaced in the width direction (X direction) by a dimension b.

Figure 3:
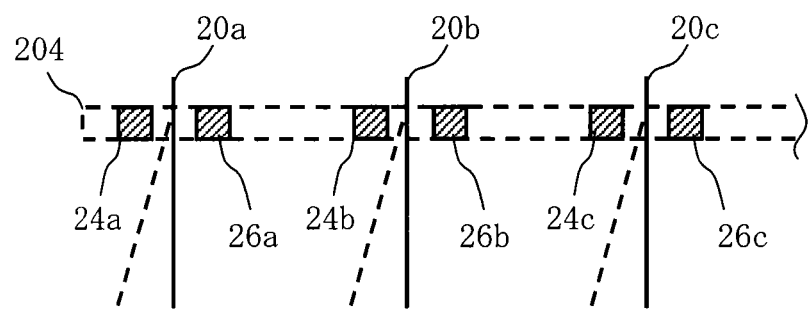
FIG. 3 is a conceptual diagram showing the configuration of a blanking plate according to Embodiment 1.

FIG. 3 is a conceptual diagram showing the configuration of a blanking plate according to Embodiment 1. The blanking plate 204 has passing holes formed by fitting to the arrangement position of each of the holes 22 of the aperture plate member 203 and a set of two electrodes 24, 26 (blanker: first deflector) as a pair is arranged in each passing hole. The electron beam 20 passing through each passing hole is independently deflected by the voltage applied to the two electrodes 24, 26 as a pair. Blanking control is exercised by such deflection. Thus, a plurality of blankers performs blanking deflection of corresponding beams of multiple beams having passed through the plurality of holes 22 (openings) of the aperture plate member 203.

The electron beam 200 emitted from the electron gun assembly 201 (emission unit) illuminates the whole first aperture plate 203 almost perpendicularly through the illumination lens 202. The aperture plate member 203 has a plurality of rectangular holes (openings) formed therein and the electron beam 200 illuminates a region containing all the plurality of holes. A plurality of electron beams (multiple beams) 20a to 20e is formed by each of the plurality of holes of the aperture plate member 203 being passed by each portion of the electron beam 200 by which positions of the plurality of holes are irradiated. The multiple beams 20a to 20e pass through respective corresponding blankers (first deflectors) of the blanking plate 204. Such blankers individually deflect (performs blanking deflection) the passing electron beam 20. Then, the multiple beams 20a to 20e having passed through the blanking plate 204 are reduced by the reducing lens 205 before traveling toward the center hole formed in the limited aperture plate member 206. The electron beam 20 deflected by the blanker of the blanking plate 204 deviates from the center hole of the limited aperture plate member 206 (blanking aperture plate member) before being shielded by the limited aperture plate member 206. On the other hand, the electron beam 20 not deflected by the blanker of the blanking plate 204 passes through the center hole of the limited aperture plate member 206. The blanking control is exercised by ON/OFF of the blankers to control ON/OFF of the beam. Thus, the limited aperture plate member 206 shields each beam deflected so as to be in an OFF state by the plurality of blankers. Then, a beam of one shot is formed by a beam formed between beam-ON and beam-OFF and having passed through the limited aperture plate member 206. Pattern images of the multiple beams 20 having passed through the limited aperture plate member 206 are focused by the objective lens 207 before respective irradiation positions on the target object 101 being therewith irradiated.

The writing apparatus 100 performs a pattern writing operation by a raster scan method by which a shot beam is continuously and successively irradiated while the XY stage 105 moves and when a desired pattern is written, a necessary beam is controlled to beam-ON by blanking control in accordance with the pattern.

Figure 4A:
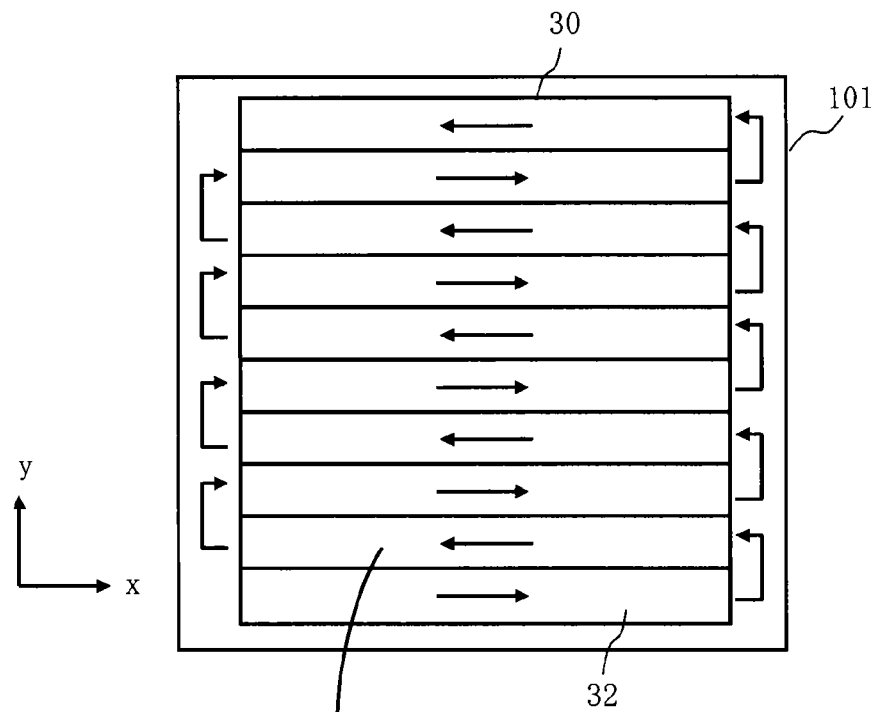
FIGS. 4A to 4C are conceptual diagrams for explaining a pattern writing operation according to Embodiment 1.
Figure 4B:
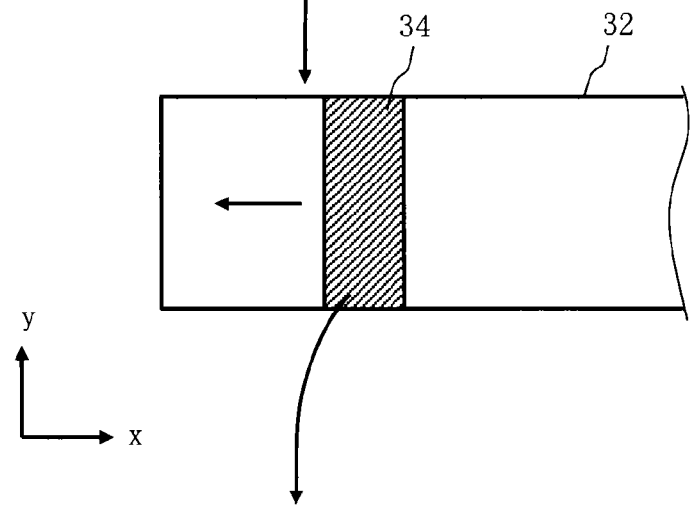
Figure 4C:
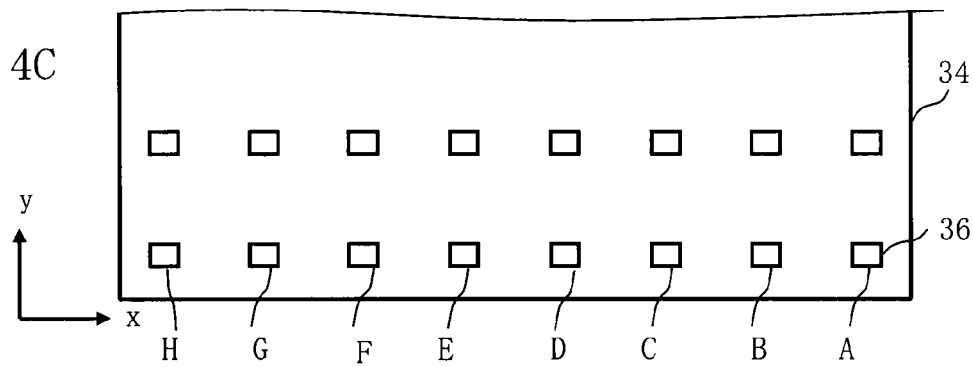

FIGS. 4A to 4C are conceptual diagrams for explaining a pattern writing operation according to Embodiment 1. As shown in FIG. 4A, a pattern writing region 30 of the target object 101 is virtually divided into a plurality of stripe regions 32 in a thin rectangular shape in a predetermined width toward, for example, the Y direction. Each of the stripe regions 32 becomes a region of the pattern writing unit. First, the XY stage 105 is moved to make adjustments so that an irradiation region 34 that can be irradiated with the multiple beams 20 at a time is positioned at the left end of the first stripe region 32 or further to the left before starting to write a pattern. When a pattern is written to the first stripe region 32, the pattern is written relatively in the X direction by moving the XY stage 105 in, for example, the −X direction. The XY stage 105 is, for example, continuously moved at a predetermined speed. After the pattern writing of the first stripe region 32 is completed, the stage position is moved in the −Y direction to make adjustments so that the irradiation region 34 is positioned at the right end of the second stripe region 32 or further to the right relatively in the Y direction before similarly writing a pattern toward the −Y direction by moving, this time, as shown in FIG. 4B, the XY stage 105 in, for example, the X direction. The pattern writing time can be reduced by alternately changing the direction to write a pattern like writing a pattern to the third stripe region 32 toward the X direction and writing a pattern to the fourth stripe region 32 toward the −X direction. However, the method of writing a pattern is not limited to writing a pattern by alternately changing the direction and when a pattern is written to each of the stripe regions 32, the pattern may be written in the same direction. In the first shot, as shown in FIG. 4C, a plurality of shot patterns 36 whose number is equal to the number of the holes 22, is formed at a time by multiple beams formed by passing through each of the holes 22 of the aperture plate member 203. For example, the position of "A" shown in FIG. 4C is irradiated with a beam having passed through a hole A of the aperture plate member 203 to form the shot pattern 36 in the position. Similarly, the position of "B" shown in FIG. 4C is irradiated with a beam having passed through a hole B of the aperture plate member 203 to form the shot pattern 36 in the position. This also applies to C to H. Then, a pattern is written by the raster scan method by which when a pattern is written to each of the stripes 32, a shot beam is irradiated continuously and successively while the XY stage 105 moves toward the X direction.

Here, as described above, the target object 101 is placed above the XY stage 105 and a pattern is written on the target object 101 while moving the stage or performing a step and repeat operation. However, a pattern cannot be written to a desired position if the position of the XY stage 105 is displaced. This is, for example, a case when position displacements ($\Delta x$, $\Delta y$) in the X, Y directions or a rotational position displacement ($\Delta \theta$) of the XY stage 105 arises. Position displacements ($\Delta x$, $\Delta y$) in the X, Y directions of the XY stage 105 can be adjusted by moving the XY stage 105 in the X, Y directions, but it is difficult to correct a rotational position displacement ($\Delta \theta$) even if the XY stage 105 is moved in the X, Y directions. Thus, in Embodiment 1, a pattern is written by rotating a beam image to fit to the rotational position displacement ($\Delta \theta$) of the stage by using the electrostatic lenses 212, 214 arranged in respective magnetic fields of a set of electromagnetic lenses whose magnetic fields are in opposite directions.

Figure 5:
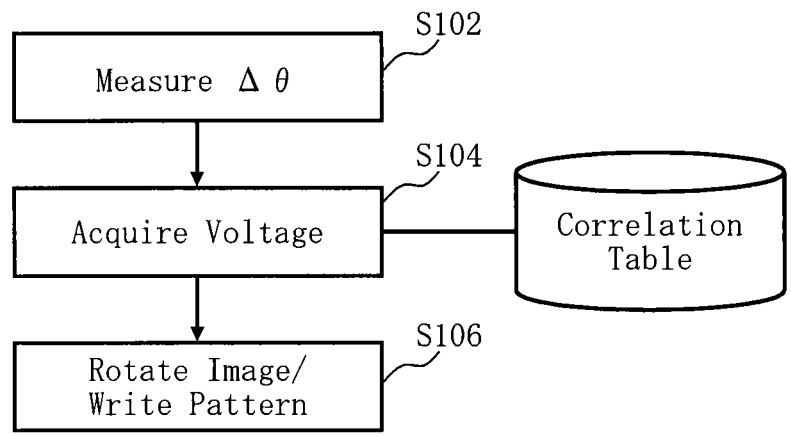
FIG. 5 is a flow chart showing principal processes of a method of writing a pattern according to Embodiment 1.

FIG. 5 is a flow chart showing principal processes of a method of writing a pattern according to Embodiment 1. In FIG. 5, the method of writing a pattern according to Embodiment 1 executes a series of processes including a rotational position displacement measuring process of a stage (S102), a voltage acquisition process (S104), and an image rotation and pattern writing process (S106).

As the rotational position displacement measuring process of a stage (S102), the rotational error measuring unit 50 measures a position displacement amount $\Delta\theta$ (rotational error) of the XY stage 105 above which the target object 101 is placed, in the rotation direction.

Figure 6:
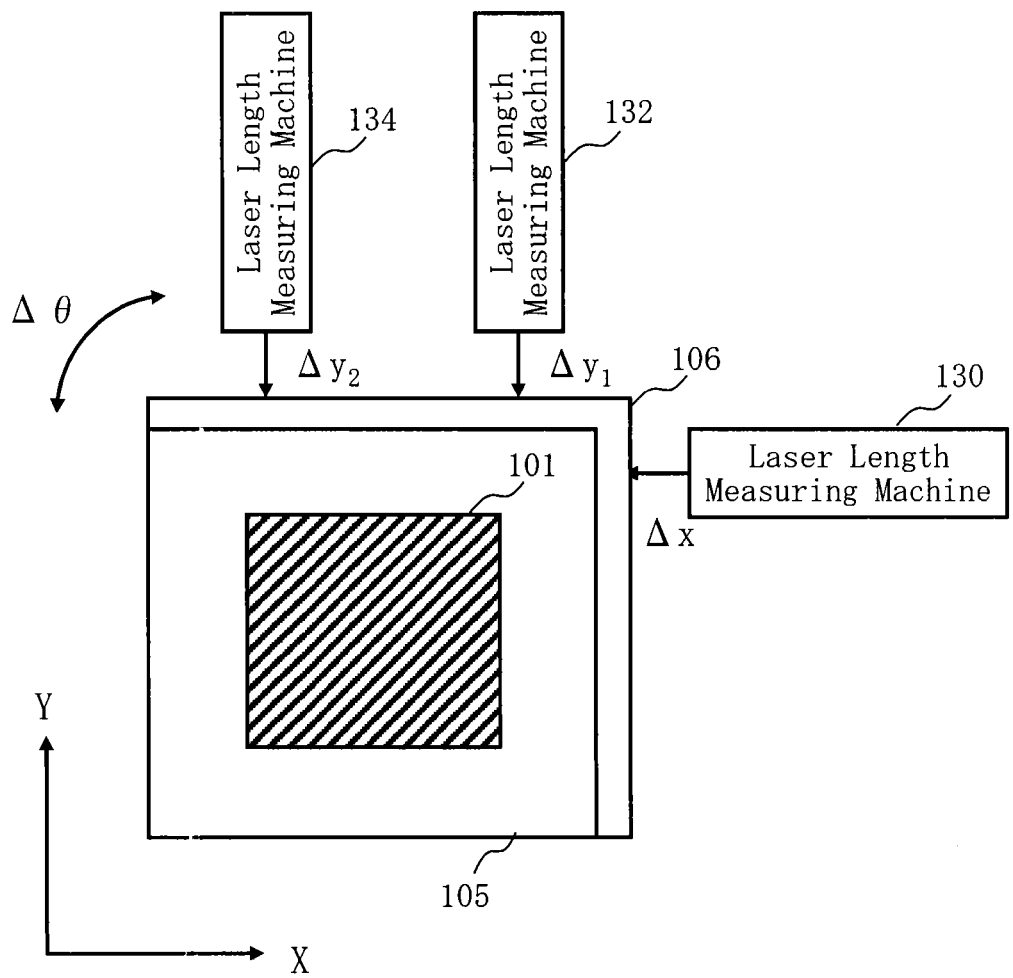
FIG. 6 is a conceptual diagram for explaining a measuring method of a stage error according to Embodiment 1.

FIG. 6 is a conceptual diagram for explaining a measuring method of stage errors according to Embodiment 1. In FIG. 6, the mirror 106 is arranged above the XY stage 105 along the X and Y directions. Then, an error ($\Delta x$) in the X direction and an error ($\Delta y$) in the Y direction are measured by using at least the three laser length measuring machines 130, 132, 134. In the example of FIG. 6, the error in the X direction is measured at one location by the laser length measuring machine 130. On the other hand, the error in the Y direction is measured at two locations by the two laser length measuring machines 132, 134 by displacing the position in the X direction. Accordingly, the error ($\Delta x$) in the X direction and the errors ($\Delta y1$, $\Delta y2$) in the Y direction with respected to the designed reference position can be measured. By measuring the three errors, the rotational error $\Delta\theta$ of the XY stage 105 can be calculated. The rotational error $\Delta\theta$ of the XY stage 105 can be calculated at least from measurement results of the two laser length measuring machines 132, 134 whose position is displaced in the X direction. By using the preset distance x' between the two laser length measuring machines 132, 134 and a difference y' between the errors ($\Delta y1$, $\Delta y2$) in the Y direction measured by the two laser length measuring machines 132, 134, the rotational error may be determined by $\Delta\theta=\tan^{-1}(y'/x')$.

Figure 7:
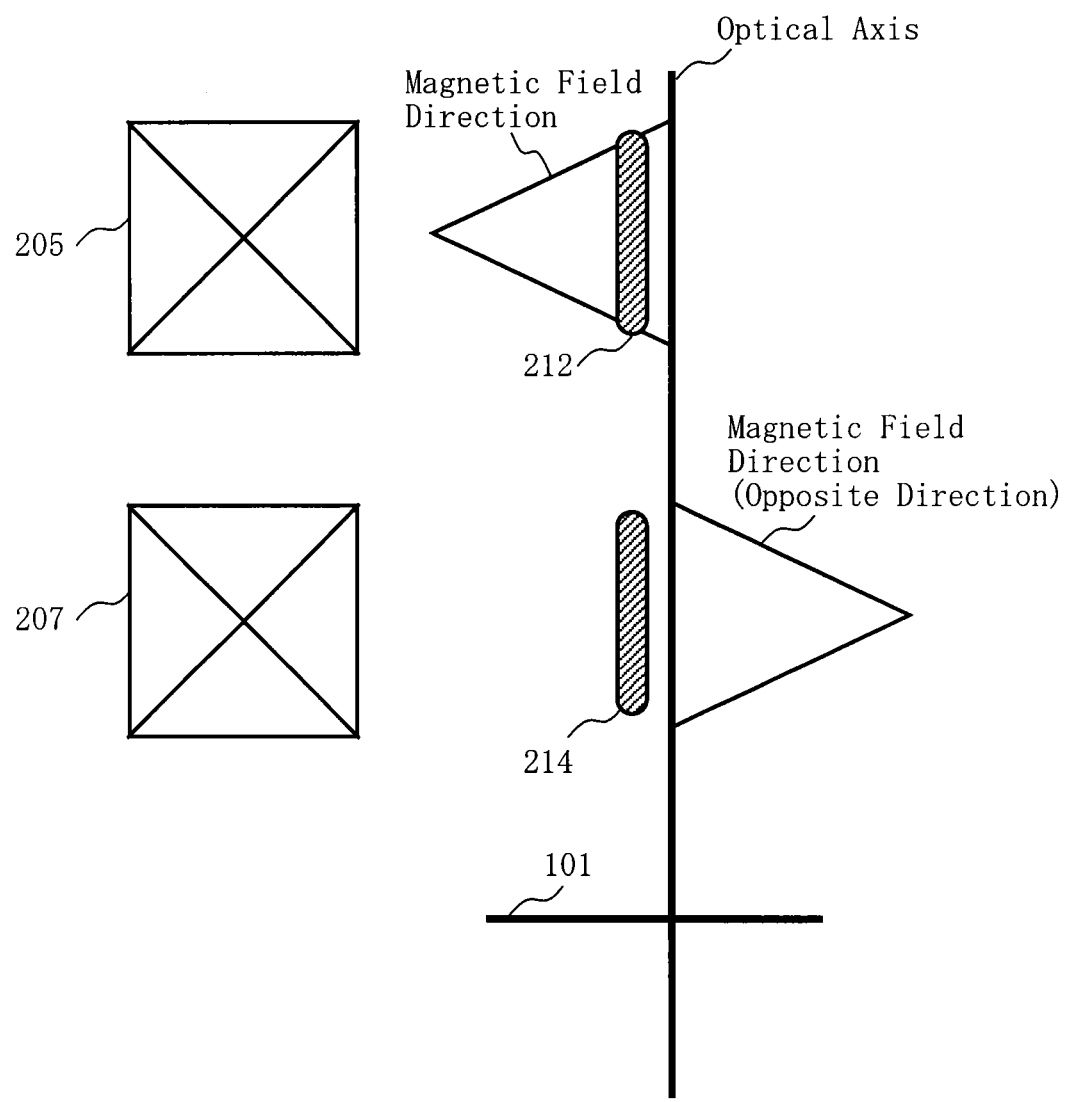
FIG. 7 is a diagram showing an example of arrangement positions of an electromagnetic lens and an electrostatic lens according to Embodiment 1.

FIG. 7 is a diagram showing an example of arrangement positions of an electromagnetic lens and an electrostatic lens according to Embodiment 1. As shown in FIG. 7, the reducing lens 205 and the objective lens 207 are both configured by an electromagnetic lens and arranged in such a way that the magnetic fields thereof are in opposite directions. The electrostatic lens 212 is arranged in a magnetic field of the reducing lens 205. The electrostatic lens 214 is arranged in a magnetic field of the objective lens 207.

Figure 8:
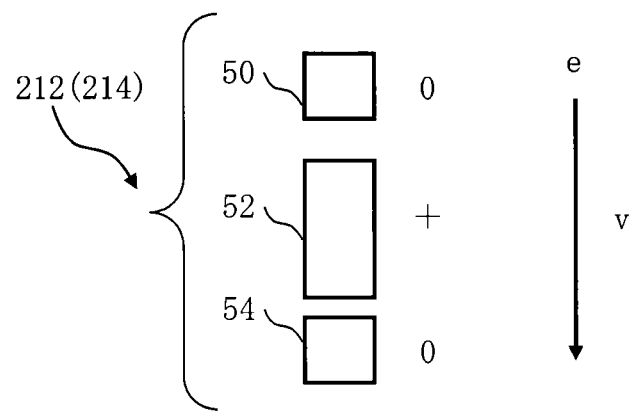
FIG. 8 is a schematic diagram showing an example of the electrostatic lens according to Embodiment 1.

FIG. 8 is a schematic diagram showing an example of the electrostatic lens according to Embodiment 1. The electrostatic lenses 212, 214 are configured by, for example, 3-stage electrodes 50, 52, 54 in a ring shape and the focus of the multiple beams 20 can be adjusted by the voltage of 0 V being applied to the upper and lower electrodes 50, 54 and a voltage being applied to the middle electrode 52. On the other hand, electrons passing through the electrostatic lenses 212, 214 change in speed v accompanying voltage variations. In an approximation in which the relativistic effect can be ignored, a rotation amount $\theta$ of the image is proportional to a value obtained by integrating a value obtained by dividing a magnetic field B by a traveling speed v of electrons with respect to a distance z along the optical axis. Thus, the electrostatic lenses 212, 214 can adjust the rotation amount $\theta$ of the image. Therefore, by adjusting the voltages applied to the electrostatic lenses 212, 214, a beam image can be rotated while the lenses being brought into focus. Incidentally, if the relativistic effect is included, a similar effect can be obtained.

Figure 9:
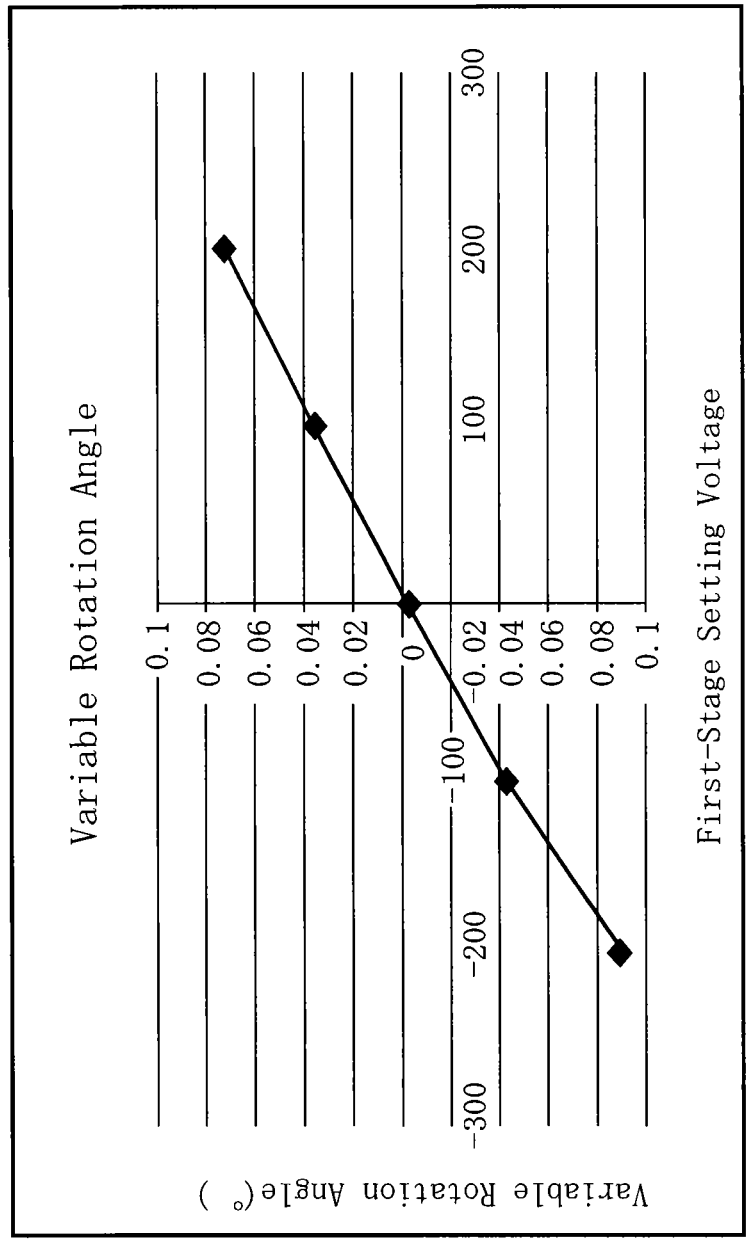
FIG. 9 is a diagram showing an example of rotational variations of an image when the voltage is made variable by the 2-stage electrostatic lenses according to Embodiment 1.

FIG. 9 is a diagram showing an example of rotational variations of an image when the voltage is made variable by the 2-stage electrostatic lenses according to Embodiment 1. The relativistic effect is not taken into consideration in the present calculation. Here, for example, an example of a variable rotation angle (°) of an image when the voltages of the 2-stage electrostatic lenses 212, 214 are made variable while adjusting the voltages applied to the 2-stage electrostatic lenses 212, 214 so that the focus of the multiple beams 20 is adjusted onto the surface of the target object 101 by the objective lens 207 and the focus is fixed to the position. In the example of FIG. 9, a result when the voltage of the electrostatic lens 214 of the second stage is adjusted so that, after the voltage of the electrostatic lens 212 of the first stage is made variable, the focus is not displaced each time from the fixed position. Therefore, a set of voltages applied to the 2-stage electrostatic lenses 212, 214 to rotate a beam image to a desired angle without displacing the focus position exists.

Thus, a correlation table is created in which correlations between the variable rotation angle of a beam image by the whole multiple beams 20 and a set of voltages applied to the 2-stage electrostatic lenses when the set of voltages applied to the 2-stage electrostatic lenses is allocated so that the focus position of an electron beam (the whole multiple beams 20) is not displaced are defined. Such a correlation table is stored in the storage device 140. Such a correlation may be determined in advance by a simulation or experiment to create a correlation table, which is stored in the storage device 140.

As the voltage acquisition process (S104), the voltage acquisition unit 52 refers to a correlation table stored in the storage device 140 to acquire a set of voltages applied to the electrostatic lenses 212, 214 to rotate a beam image by the whole multiple beams 20 in such a way that a focus displacement of an electron beam (the whole multiple beams 20) passing through the reducing lens 205 and the objective lens 207 (a plurality of electromagnetic lenses) does not arise and the position displacement amount $\Delta\theta$ measured in the rotation direction of the XY stage 105 is corrected. A more appropriate set of voltages is acquired for points deviating from data points of the correlation table by interpolation or extrapolation from surrounding data points. Alternatively, when the error is small, the value of the closest data point may be used. Instead of storing the correlation table itself, one or a plurality of functions approximating a portion or all of data of the correlation table may be determined and parameters to describe the one or the plurality of functions may be stored to determine a set corresponding to desired conditions. Hereinafter, the correlation table is described as referred to for the sake of simplicity.

Here, a set of voltages of the 2-stage electrostatic lenses 212, 214 that rotate a beam image in the same direction as the position displacement amount $\Delta\theta$ by fitting to the position displacement amount $\Delta\theta$ while preventing the focus position adjusted by the objective lens 207 from changing is acquired. By rotating the beam image in the same direction as the position displacement amount $\Delta\theta$ of the XY stage 105 in the rotation direction, the beam image is transferred to the same position on the target object 101 as the position where a pattern is written in a state in which no position displacement of the XY stage 105 in the rotation direction arises.

As the image rotation and pattern writing process (S106), the beam image is rotated by using the electrostatic lenses 212, 214 in such a way that a focus displacement of an electron beam passing through the reducing lens 205 and the objective lens 207 does not arise and the position displacement amount measured in the rotation direction of the XY stage 105 is corrected and the pattern generator 150 writes a pattern of the beam image on the target object 101 above the XY stage 105 while the beam image being rotated. More specifically, first the acquired set of voltages of the electrostatic lenses 212, 214 is output to the control circuit 112 for writing a pattern. Then, the control circuit 112 outputs a voltage signal for the electrostatic lens 212 to the amplifier 120 and a voltage signal for the electrostatic lens 214 to the amplifier 122. Upon receipt of the voltage signal, the amplifier 120 applies the corresponding voltage to the electrostatic lens 212. Upon receipt of the voltage signal, the amplifier 122 applies the corresponding voltage to the electrostatic lens 214. In addition, the pattern generator 150 controlled by the control circuit 112 writes a pattern of the beam image on the target object 101 above the XY stage 105.

Figure 10A:
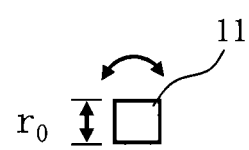
FIGS. 10A and 10B are conceptual diagrams for explaining an example of an effect of the 2-stage electrostatic lenses in Embodiment 1.
Figure 10B:
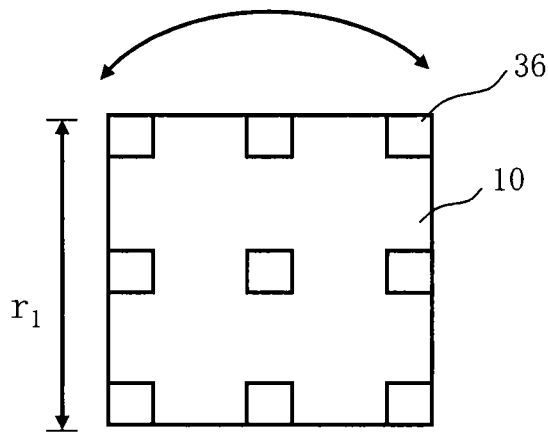

FIGS. 10A and 10B are conceptual diagrams for explaining an example of an effect of the 2-stage electrostatic lenses in Embodiment 1. In a single beam system, as shown in FIG. 10A, the irradiation area is a shot figure 11 of one beam and a rotation radius r0 is small. Thus, even if a rotational error of the stage arises, the position error thereof is small. In a multibeam system, by contrast, as shown in FIG. 10B, a large number of shot figures 36 by a large number of beams are irradiated by one shot and an irradiation area 10 is large. Thus, a rotation radius r1 increases correspondingly. Thus, if a rotational error of the stage arises, the whole irradiation area 10 rotates and the position displacement amount of each of the shot figures 36 increases. Therefore, the rotational error of the stage is canceled out by arranging 2-stage electrostatic lenses as in Embodiment 1 so that such a position displacement can be suppressed. Particularly in a multi-beam system, the effect thereof is significant.

According to Embodiment 1, as described above, a pattern can be written to a desired position even if the rotational position of the stage is displaced. Therefore, a pattern can be written with high precision.

Embodiment 2

In the above example in Embodiment 1, the voltages of the electrostatic lenses 212, 214 are adjusted so that the focus position adjusted by the objective lens 207 does not change, but the embodiment is not limited to such an example. When writing a pattern by an electron beam, a pattern is written while, for example, the XY stage 105 moves and thus, the pattern writing position changes each time. In addition, the target object surface may not be a flat surface and irregularities may be present. Thus, the height of the target object surface irradiated with the multiple beams 20 changes. Therefore, a focus displacement of the multiple beams 20 may dynamically be corrected (dynamic focus) by the electrostatic lenses 212, 214 during pattern writing.

Figure 11:
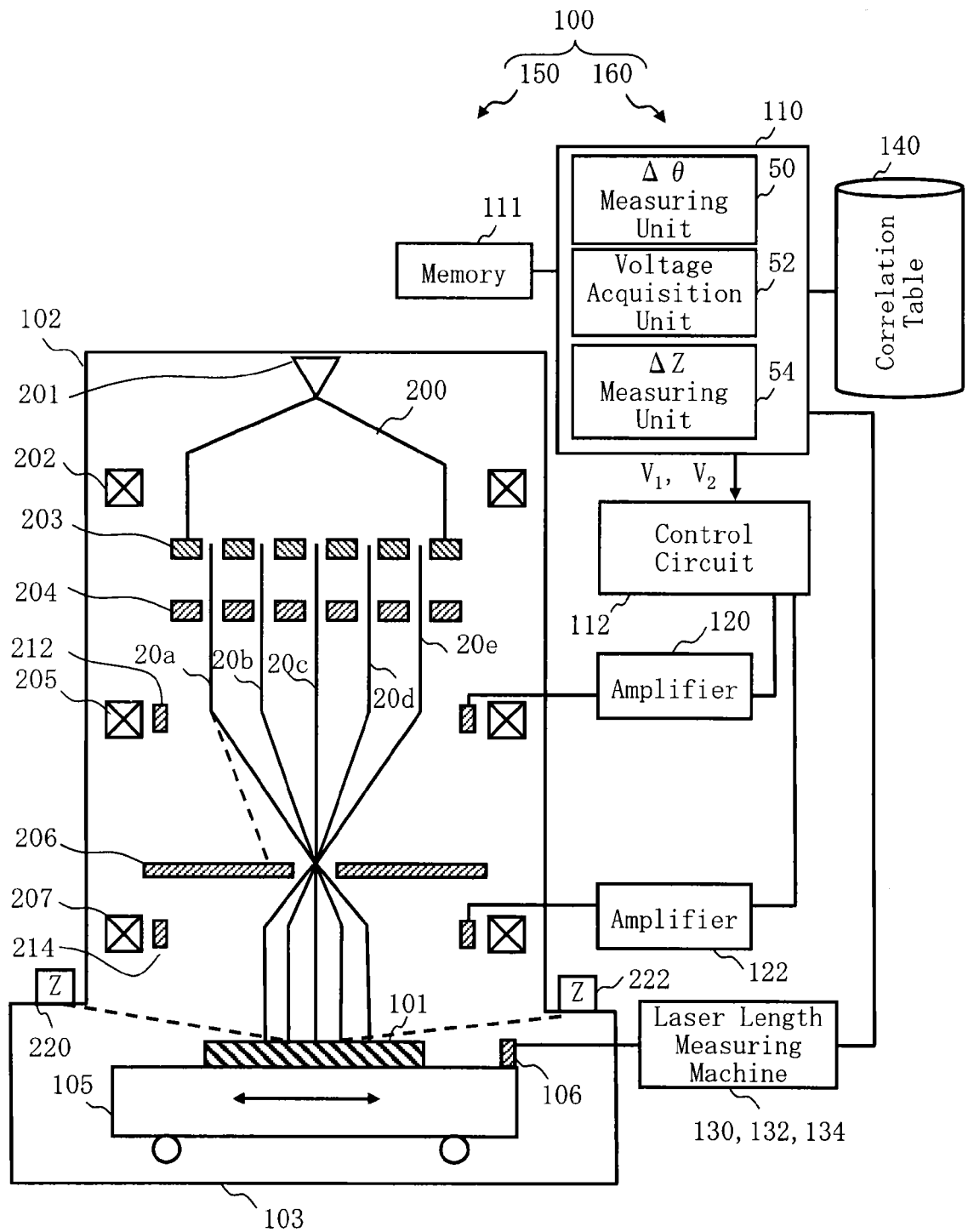
FIG. 11 is a conceptual diagram showing the configuration of the writing apparatus according to Embodiment 2.

FIG. 11 is a conceptual diagram showing the configuration of the writing apparatus according to Embodiment 2. FIG. 11 is the same as FIG. 1 except that a Z sensor including a floodlight 220 and an optical receiver 222 to measure the height of the surface of the target object 101 is arranged in the pattern writing chamber 103 and a height measuring unit 54 is further arranged in the control computer 110.

The function such as the rotational error measuring unit 50, the voltage acquisition unit 52, or the height measuring unit 54 may be configured by hardware such as an electric circuit or by software such as a program executing these functions. Alternatively, the function may be configured by a combination of hardware and software. Information input into or output from the rotational error measuring unit 50, the voltage acquisition unit 52, and the height measuring unit 54 and information during operation are stored in the memory 111 each time.

Figure 12:
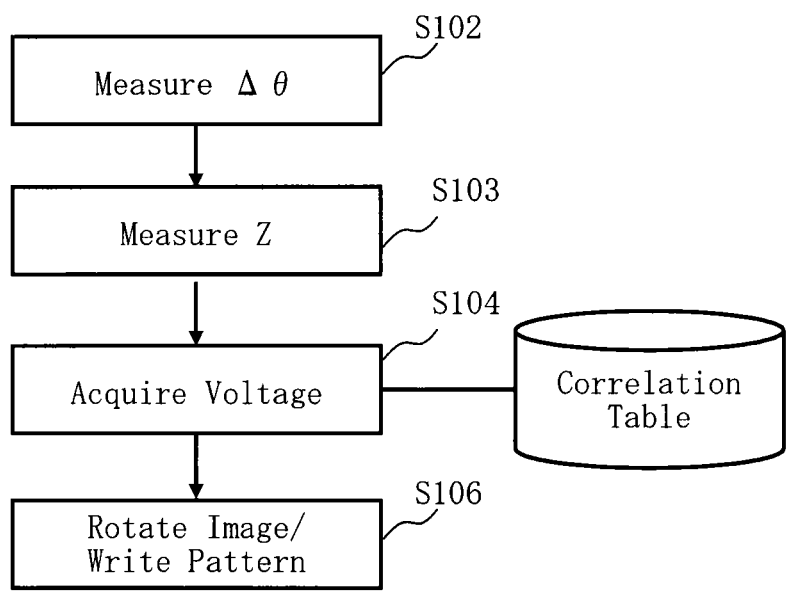
FIG. 12 is a flow chart showing principal processes of the method of writing a pattern according to Embodiment 2.

FIG. 12 is a flow chart showing principal processes of the method of writing a pattern according to Embodiment 2. In FIG. 12, the method of writing a pattern according to Embodiment 2 is the same as that in FIG. 5 except that a Z measuring process (S103) is executed between the rotational position displacement measuring process of a stage (S102) and the voltage acquisition process (S104). The Z measuring process (S103) may be executed prior to the rotational position displacement measuring process of a stage (S102) if executed prior to the voltage acquisition process (S104).

Hereinafter, content not specifically mentioned is the same as in Embodiment 1.

Figure 13:
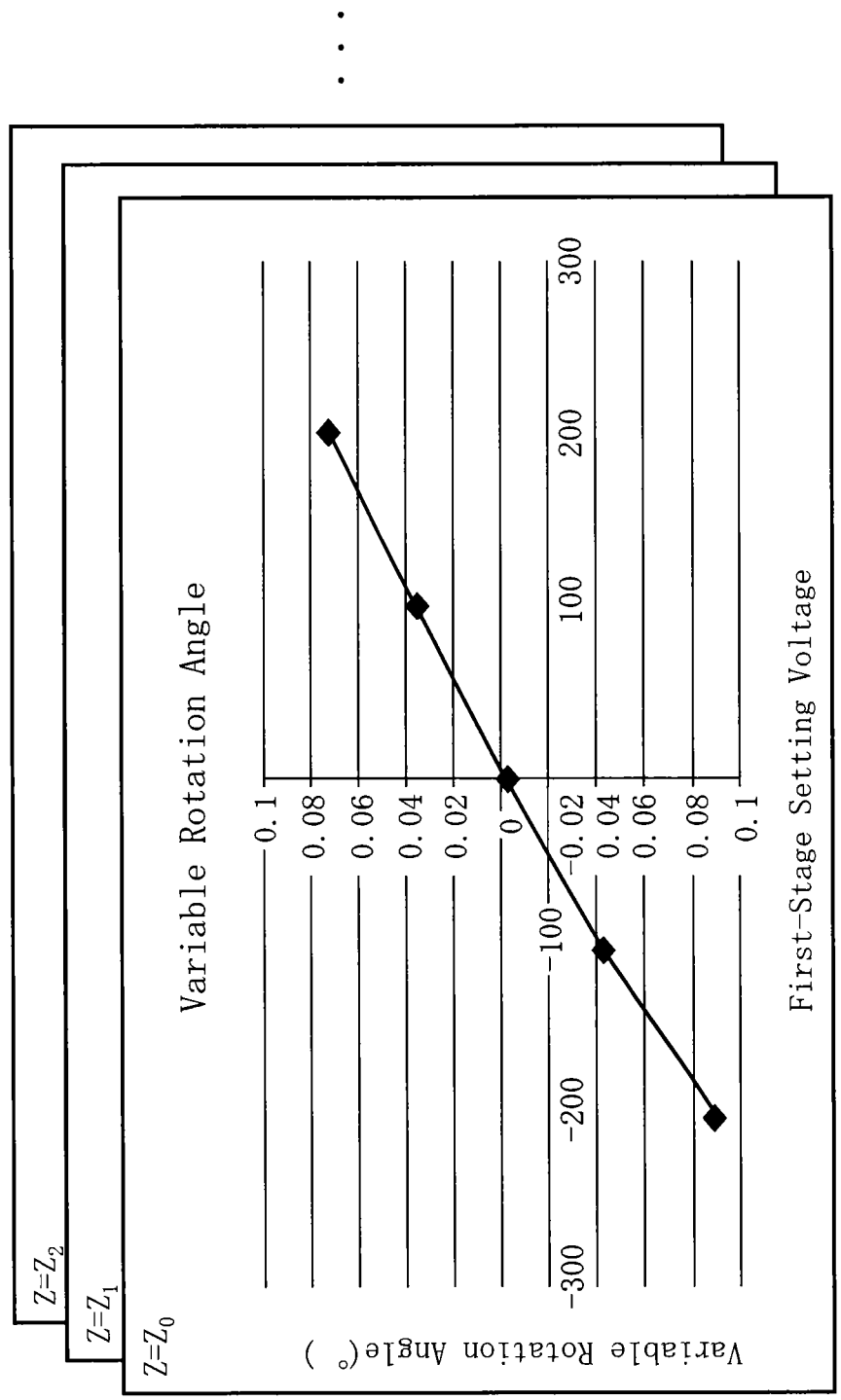
FIG. 13 is a diagram showing another example of rotational variations of the image when the voltage is made variable by the 2-stage electrostatic lenses according to Embodiment 2.

FIG. 13 is a diagram showing another example of rotational variations of the image when the voltage is made variable by the 2-stage electrostatic lenses according to Embodiment 2. Here, an example of the correlation table is shown in which correlations between the variable rotation angle of a beam image and a set of voltages applied to the 2-stage electrostatic lenses when a set of voltages applied to the 2-stage electrostatic lenses is allocated while, after a focus position is set, attempting to fix the focus to the focus position for each focus position under the assumption that dynamic focusing is performed by, for example, the electrostatic lenses 212, 214 are defined. Such a correlation table is stored in the storage device 140. Such a correlation may be determined in advance by a simulation or experiment to create a correlation table, which is stored in the storage device 140.

In the Z measuring process (S103), the height measuring unit 54 measures the height of the surface of the target object 101 above the XY stage 105 by using a Z sensor. First, the XY stage 105 is moved in such a way that a region to be measured of the surface of the target object 101 comes to a position irradiated with light from the floodlight 220. Then, each of the stripe regions 32 is irradiated with light from the floodlight 220 to measure the height of the target object surface of each of the stripe regions 32 to acquire the distribution of height.

As the voltage acquisition process (S104), the voltage acquisition unit 52 refers to a correlation table stored in the storage device 140 to acquire a set of voltages applied to the electrostatic lenses 212, 214 to rotate a beam image by the whole multiple beams 20 in such a way that the focus of an electron beam (the whole multiple beams 20) is dynamically adjusted in accordance with the height of the surface of the target object 101 measured and the position displacement amount $\Delta\theta$ measured in the rotation direction of the XY stage 105 is corrected. Here, a set of voltages of the 2-stage electrostatic lenses 212, 214 that rotate a beam image by the whole multiple beams 20 in the same direction as the position displacement amount $\Delta\theta$ by fitting to the position displacement amount $\Delta\theta$ while dynamically changing the focus position adjusted by the objective lens 207 is acquired.

As the image rotation and pattern writing process (S106), the beam image by the whole multiple beams 20 is rotated by using the electrostatic lenses 212, 214 in such a way that the focus of an electron beam (the whole multiple beams 20) is dynamically adjusted in accordance with the height of the surface of the target object 101 measured and the position displacement amount measured in the rotation direction of the XY stage 105 is corrected and the pattern generator 150 writes a pattern of the beam image on the target object 101 above the XY stage 105 while the beam image being rotated. More specifically, first the acquired set of voltages of the electrostatic lenses 212, 214 is output to the control circuit 112 for writing a pattern. Then, the control circuit 112 outputs a voltage signal for the electrostatic lens 212 to the amplifier 120 and a voltage signal for the electrostatic lens 214 to the amplifier 122. Upon receipt of the voltage signal, the amplifier 120 applies the corresponding voltage to the electrostatic lens 212. Upon receipt of the voltage signal, the amplifier 122 applies the corresponding voltage to the electrostatic lens 214. In addition, the pattern generator 150 controlled by the control circuit 112 writes a pattern of the beam image on the target object 101 above the XY stage 105.

According to Embodiment 2, as described above, a pattern can be written to a desired position while performing dynamic focusing even if the rotational position of the stage is displaced. Therefore, a pattern can be written with still higher precision.

Embodiment 3

In Embodiment 3, a configuration in which further magnification variations of a beam image are also adjusted will be described.

Figure 14:
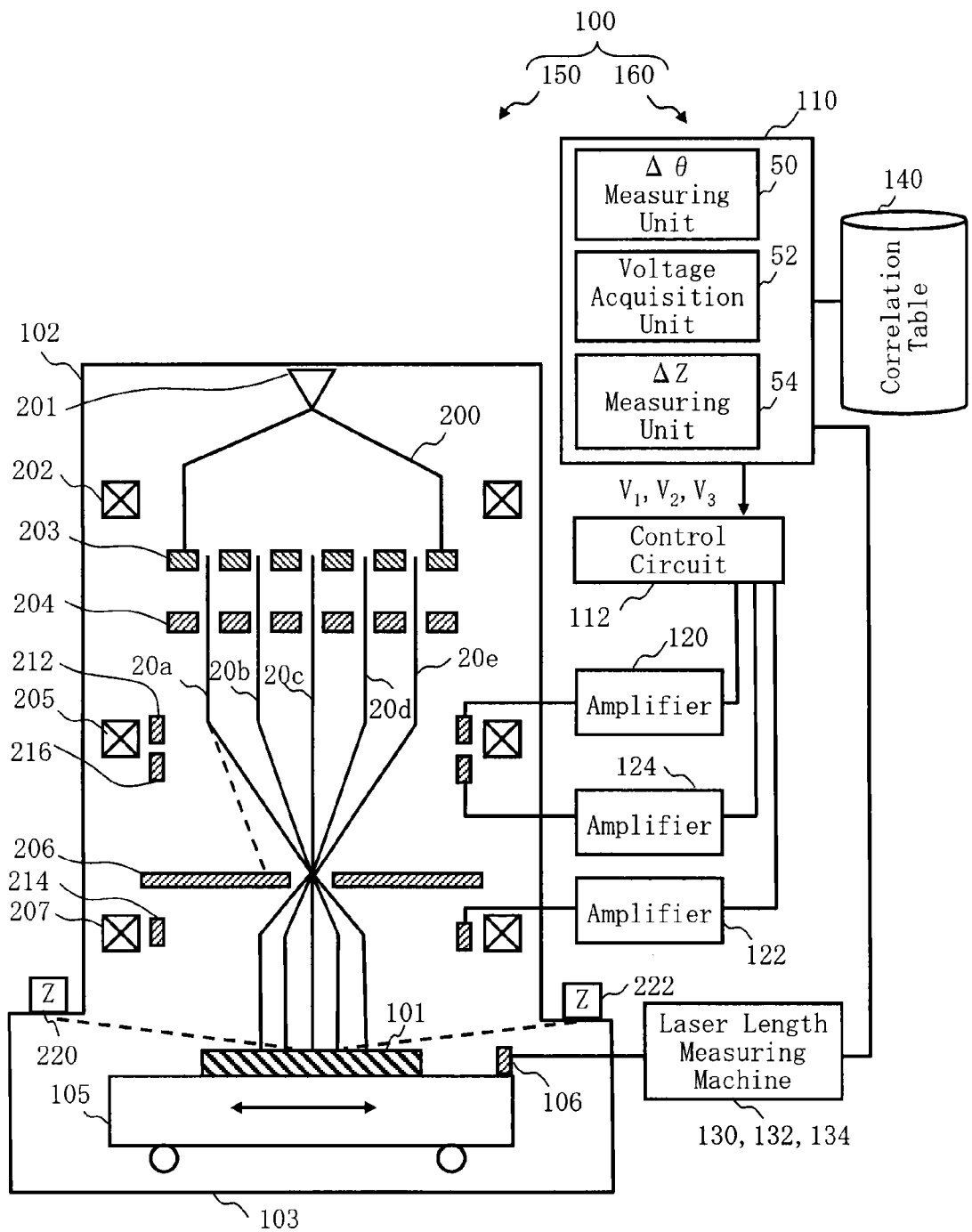
FIG. 14 is a conceptual diagram showing the configuration of the writing apparatus according to Embodiment 3.

FIG. 14 is a conceptual diagram showing the configuration of the writing apparatus according to Embodiment 3. FIG. 14 is the same as FIG. 11 except that an electrostatic lens 216 and an amplifier 124 are added. When no dynamic focusing is performed, the Z sensor including the floodlight 220 and the optical receiver 222 and the height measuring unit 54 in FIG. 14 may be omitted.

The flowchart showing principal processes of the method of writing a pattern according to Embodiment 3 is the same as in FIG. 12. When no dynamic focusing is performed, the flow chart may be the same as in FIG. 5. Hereinafter, content not specifically mentioned is the same as in Embodiment 1 or Embodiment 2.

Figure 15:
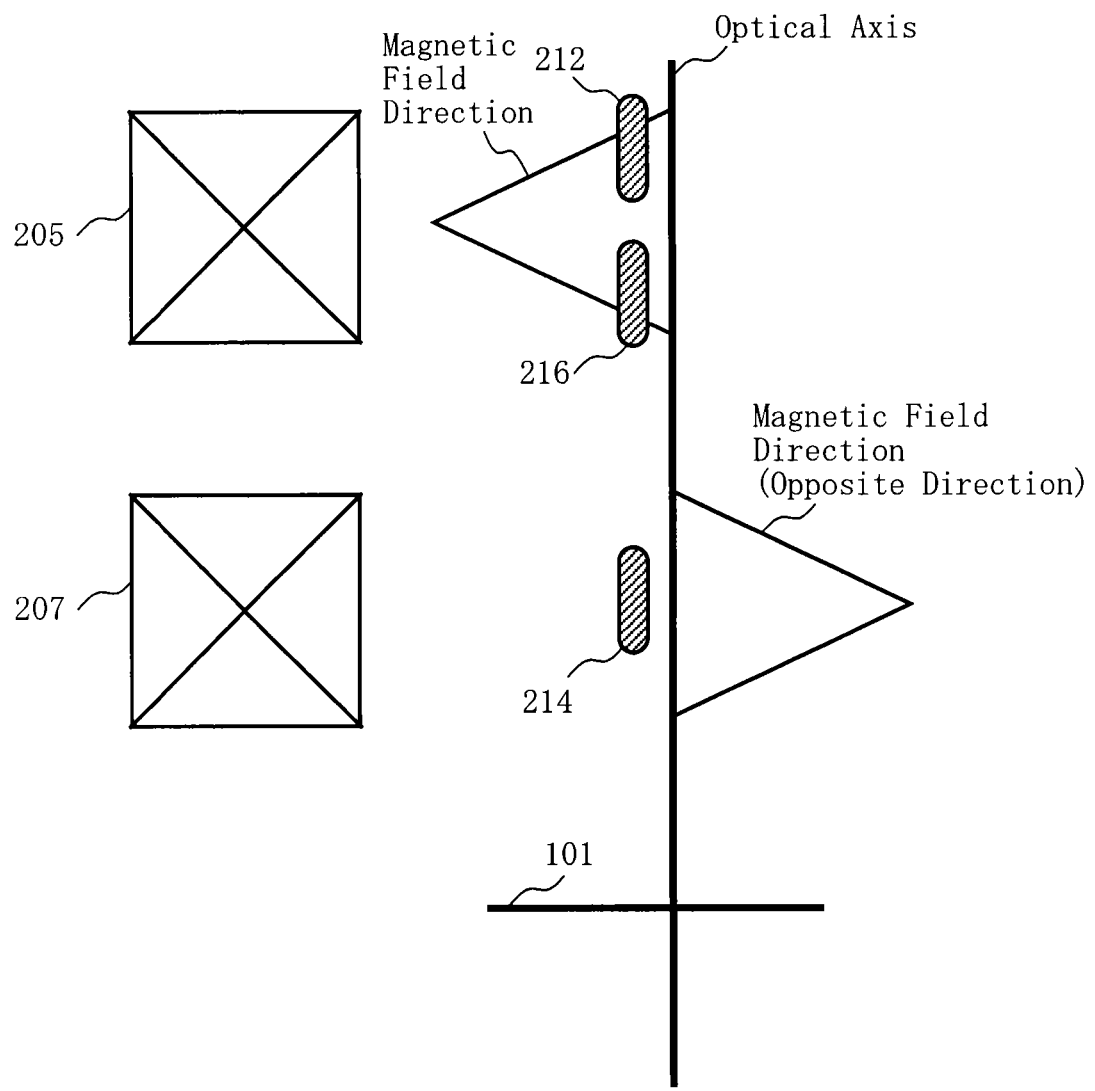
FIG. 15 is a diagram showing an example of arrangement positions of the electromagnetic lens and the electrostatic lens according to Embodiment 3.

FIG. 15 is a diagram showing an example of arrangement positions of the electromagnetic lens and the electrostatic lens according to Embodiment 3. As shown in FIG. 15, the reducing lens 205 and the objective lens 207 are both configured by an electromagnetic lens and arranged in such a way that the magnetic fields thereof are in opposite directions. The 2-stage electrostatic lenses 212, 216 are arranged in a magnetic field of the reducing lens 205. The 1-stage electrostatic lens 214 is arranged in a magnetic field of the objective lens 207. Here, the 3-stage electrostatic lenses 212, 214, 216 are arranged. The electrostatic lenses are not limited to three stages and only need to include three electrostatic lenses or more. Then, it is only necessary that at least 2-stage electrostatic lenses be arranged in one magnetic field of a plurality of electromagnetic lenses whose magnetic fields are in opposite directions and at least a 1-stage electromagnetic lens be arranged in the other magnetic field. Thus, a 1-stage electrostatic lens may be arranged on the side of the reducing lens 205 and 2-stage electrostatic lenses may be arranged on the side of the objective lens 207.

When a voltage is applied to an electrostatic lens, the magnification of a beam image of an electron beam also changes. In Embodiments 1, 2, 2-stage electrostatic lenses are used and two elements of the focus position and the rotation of an image can be controlled, but it is difficult to further control the magnification of a beam image as the third element at the same time. Thus, in Embodiment 3, the focus position, the rotation of an image, and the magnification are controlled at the same time by using 3-stage electrostatic lenses.

First, a case when no dynamic focusing is performed will be described. When no dynamic focusing is performed, it is necessary to fix the focus position to the position adjusted by the objective lens 207.

Figure 16:
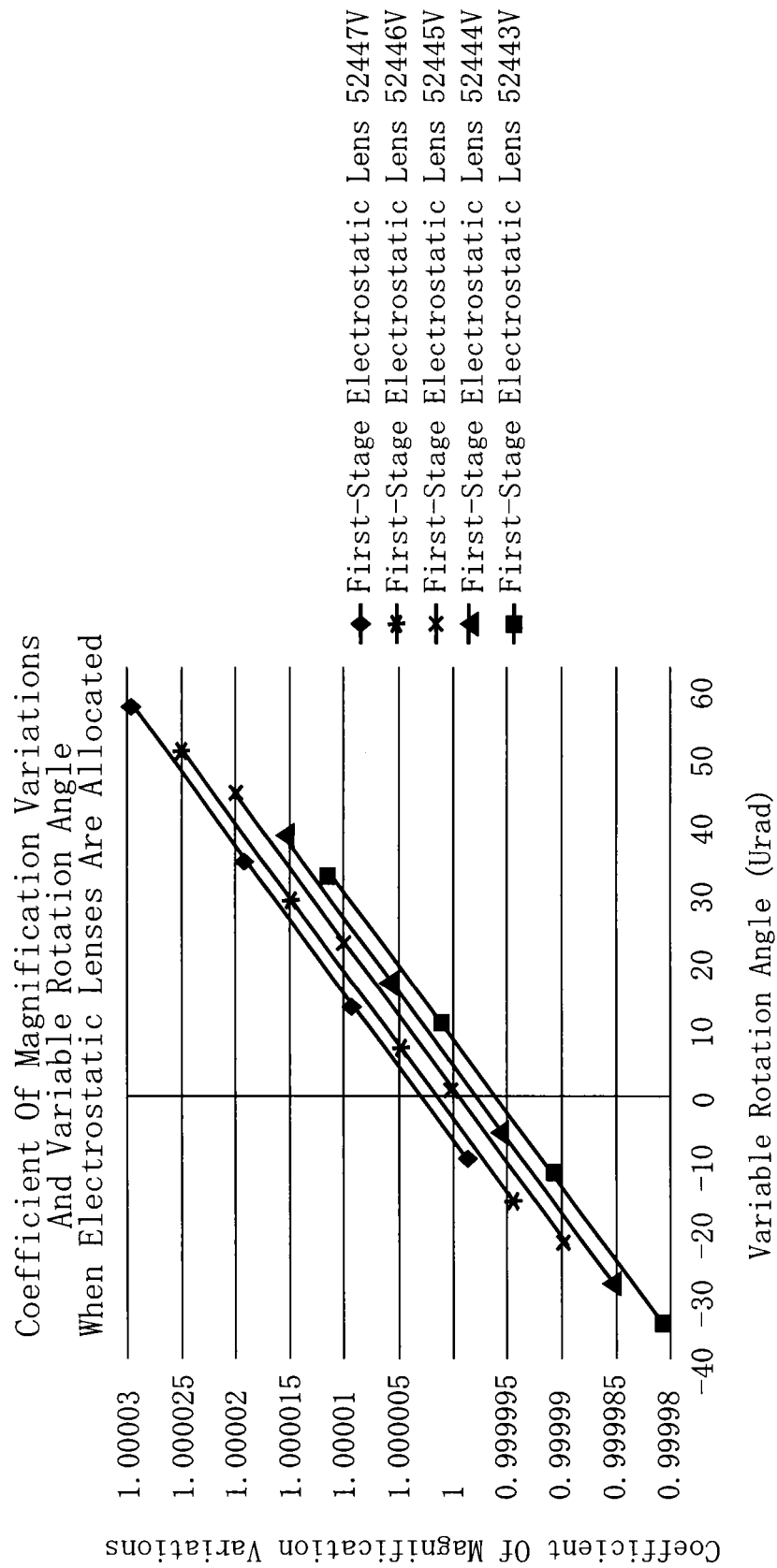
FIG. 16 is a diagram showing an example of rotational variations and magnification variations of the image when the voltage is made variable by the 3-stage electrostatic lenses according to Embodiment 3.
Figure 17:
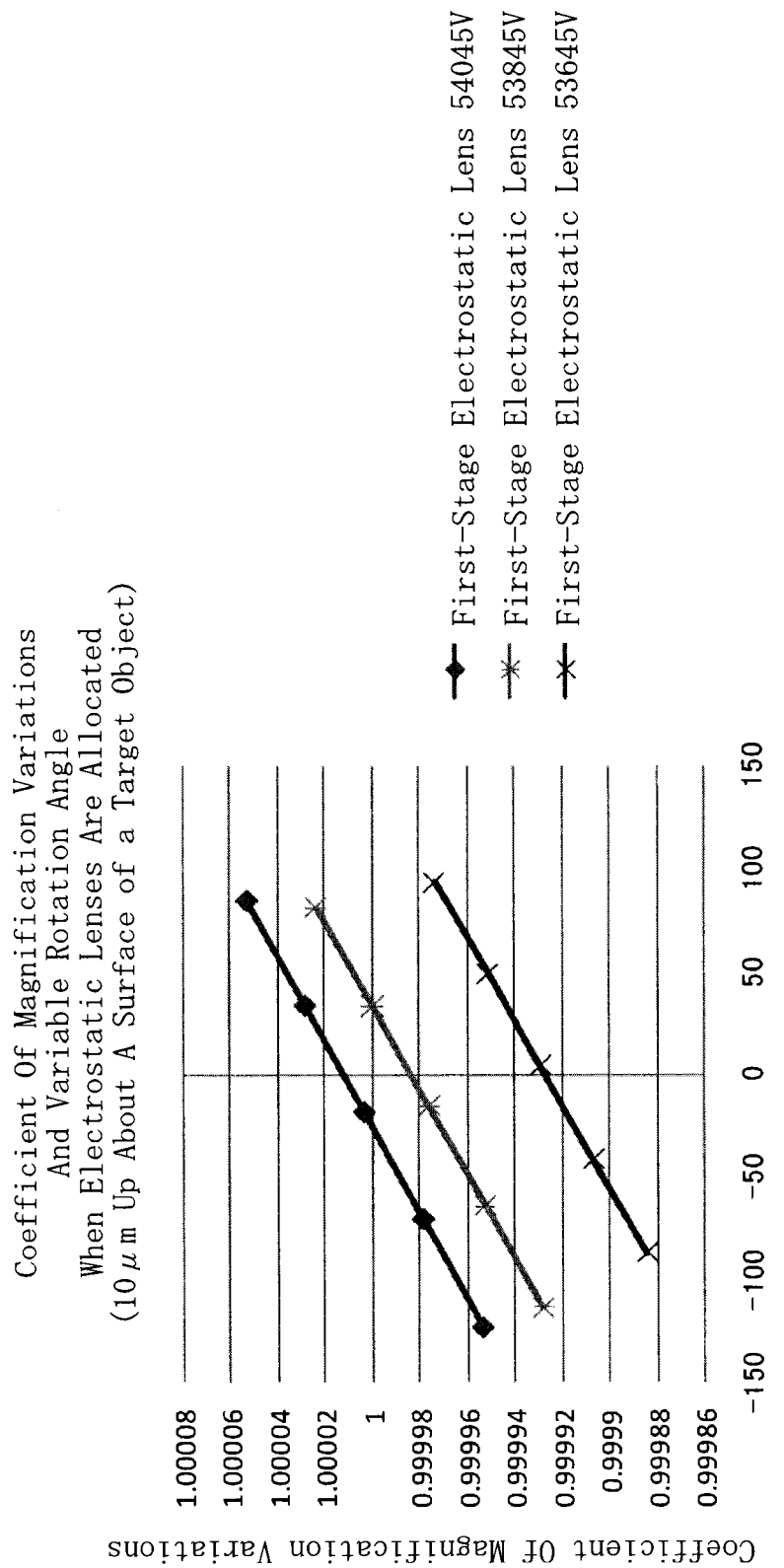
FIG. 17 is a diagram showing an example of rotational variations and magnification variations of the image when the voltage is made variable by the 3-stage electrostatic lenses according to Embodiment 3.
Figure 18:
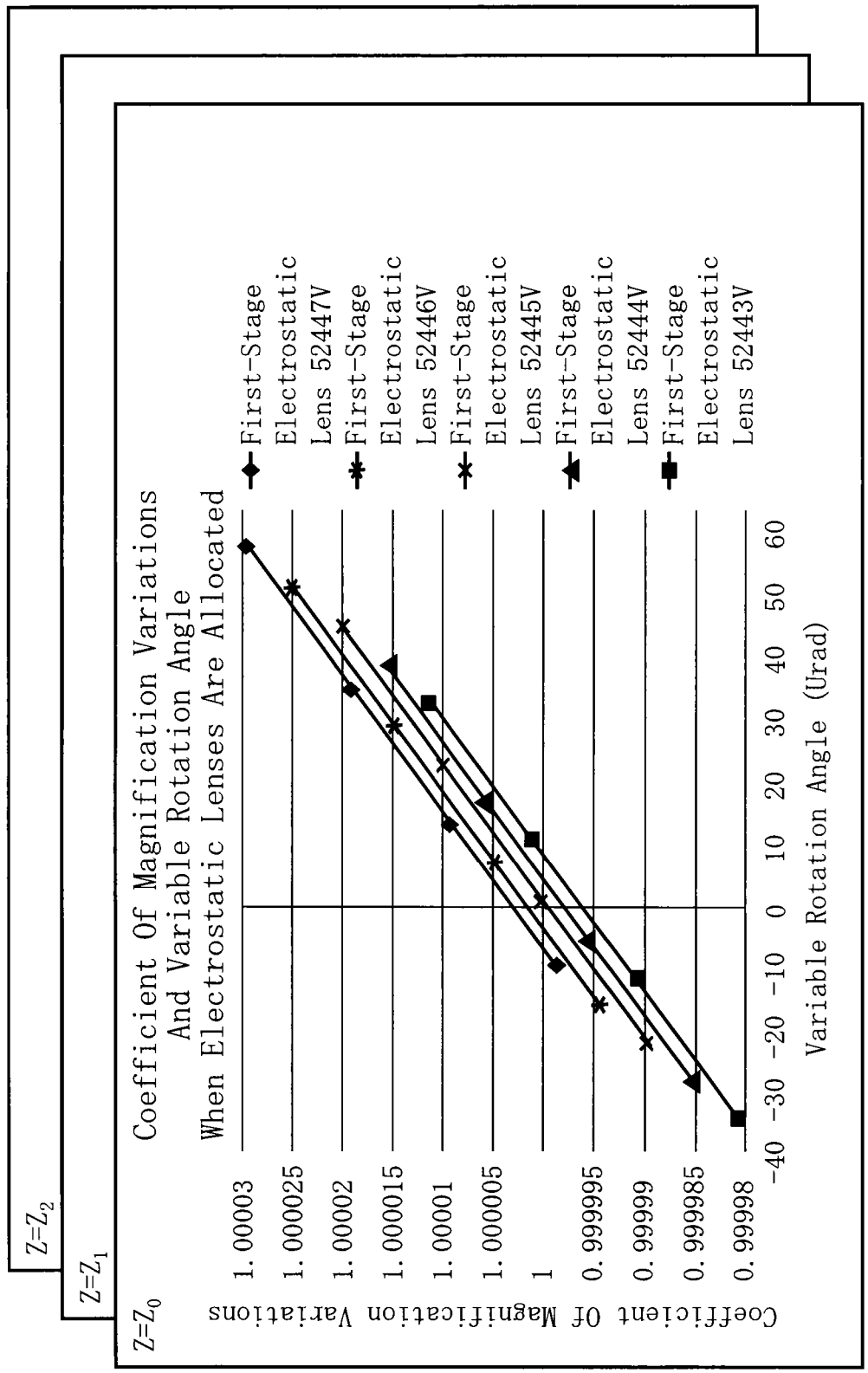
FIG. 18 is a diagram showing another example of rotational variations and magnification variations of the image when the voltage is made variable by the 3-stage electrostatic lenses according to Embodiment 3.

FIG. 16 is a diagram showing an example of rotational variations and magnification variations of the image when the voltage is made variable by the 3-stage electrostatic lenses according to Embodiment 3. Here, sets of voltages are shown as sets of relativistic potentials of electrons. That is, when a voltage Vs is applied to an electrostatic lens and energy of electrons in the electrostatic lens changes from $eV0$ to $eVtot=e(V0+Vs)$, the relativistic potential is expressed as Vtot $(1+\epsilon Vtot)$. e is the elementary charge (~1.6e−19 Coulomb) and $\epsilon$~0.9785/(MV). The present calculation shows a case of V0 to 50 kV. FIGS. 17 and 18 are shown in the same manner. Here, an example of the correlation table is shown in which correlations among the variable rotation angle of a beam image, the coefficient of magnification variations, and a set of voltages applied to the 3-stage electrostatic lenses when a set of voltages applied to the 3-stage electrostatic lenses is allocated while attempting to fix the focus to the focus position under the assumption that the focus position is fixed to the position adjusted by the objective lens 207 without performing dynamic focusing by the electrostatic lenses 212, 214 are defined. Such a correlation table is stored in the storage device 140. Such a correlation may be determined in advance by a simulation or experiment to create a correlation table, which is stored in the storage device 140.

As the voltage acquisition process (S104), the voltage acquisition unit 52 refers to a correlation table stored in the storage device 140 to acquire a set of voltages applied to the electrostatic lenses 212, 214, 216 to rotate a beam image by the whole multiple beams 20 in such a way that a focus displacement of an electron beam (the whole multiple beams 20) passing through the reducing lens 205 and the objective lens 207 (a plurality of electromagnetic lenses) does not arise, the magnification of the beam image is maintained constant, the position displacement amount $\Delta\theta$ measured in the rotation direction of the XY stage 105 is corrected. Here, a set of voltages of the 3-stage electrostatic lenses 212, 214, 216 that rotate a beam image in the same direction as the position displacement amount $\Delta\theta$ by fitting to the position displacement amount $\Delta\theta$ while preventing the focus position adjusted by the objective lens 207 from changing and maintaining the magnification of the beam image constant is acquired.

As the image rotation and pattern writing process (S106), the beam image by the whole multiple beams 20 is rotated by using the electrostatic lenses 212, 214, 216 in such a way that a focus displacement of an electron beam (the whole multiple beams 20) passing through the reducing lens 205 and the objective lens 207 does not arise, the magnification of the beam image is maintained constant, and the position displacement amount measured in the rotation direction of the XY stage 105 is corrected and the pattern generator 150 writes a pattern of the beam image on the target object 101 above the XY stage 105 while the beam image being rotated. More specifically, first the acquired set of voltages of the electrostatic lenses 212, 214, 216 is output to the control circuit 112 for writing a pattern. Then, the control circuit 112 outputs a voltage signal for the electrostatic lens 212 to the amplifier 120, a voltage signal for the electrostatic lens 214 to the amplifier 122, and a voltage signal for the electrostatic lens 216 to the amplifier 124. Upon receipt of the voltage signal, the amplifier 120 applies the corresponding voltage to the electrostatic lens 212. Upon receipt of the voltage signal, the amplifier 122 applies the corresponding voltage to the electrostatic lens 214. Upon receipt of the voltage signal, the amplifier 124 applies the corresponding voltage to the electrostatic lens 216. In addition, the pattern generator 150 controlled by the control circuit 112 writes a pattern of the beam image on the target object 101 above the XY stage 105.

According to Embodiment 3, as described above, a pattern can be written to a desired position without displacing the focus position and by maintaining the magnification of a beam image constant even if the rotational position of the stage is displaced. Therefore, a pattern can be written with still higher precision.

Next, a case when a focus displacement of the multiple beams 20 is corrected (dynamic focusing) by the electrostatic lenses 212, 214, 216 during pattern writing will be described.

FIG. 17 is a diagram showing an example of rotational variations and magnification variations of the image when the voltage is made variable by the 3-stage electrostatic lenses according to Embodiment 3. Here, an example of the correlation among the variable rotation angle of a beam image, the coefficient of magnification variations of the beam image, and a set of voltages applied to the 3-stage electrostatic lenses is shown when a set of voltages applied to the 3-stage electrostatic lenses is allocated while, after changed to some focus position, attempting the fix the focus to the focus position under the assumption that dynamic focusing is performed by, for example, the electrostatic lenses 212, 214, 216.

FIG. 18 is a diagram showing another example of rotational variations and magnification variations of the image when the voltage is made variable by the 3-stage electrostatic lenses according to Embodiment 3. Here, an example of the correlation table is shown in which correlations among the variable rotation angle of a beam image, the coefficient of magnification variations, and a set of voltages applied to the 3-stage electrostatic lenses when a set of voltages applied to the 3-stage electrostatic lenses is allocated while, after a focus position is set, attempting to fix the focus to the focus position for each focus position under the assumption that dynamic focusing is performed by, for example, the electrostatic lenses 212, 214, 216 are defined. Such a correlation table is stored in the storage device 140. Such a correlation may be determined in advance by a simulation or experiment to create a correlation table, which is stored in the storage device 140.

In the Z measuring process (S103), the height measuring unit 54 measures the height of the surface of the target object 101 above the XY stage 105 by using a Z sensor.

As the voltage acquisition process (S104), the voltage acquisition unit 52 refers to a correlation table stored in the storage device 140 to acquire a set of voltages applied to the electrostatic lenses 212, 214, 216 to rotate a beam image by the whole multiple beams 2) in such a way that the focus of an electron beam (the whole multiple beams 20) is dynamically adjusted in accordance with the height of the surface of the target object 101 measured, the magnification of the beam image is maintained constant, and the position displacement amount Δθ measured in the rotation direction of the XY stage 105 is corrected. Here, a set of voltages of the 3-stage electrostatic lenses 212, 214, 216 that rotate a beam image in the same direction as the position displacement amount Δθ by fitting to the position displacement amount Δθ while dynamically changing the focus position adjusted by the objective lens 207 and maintaining the magnification of the beam image constant is acquired.

As the image rotation and pattern writing process (S106), the beam image by the whole multiple beams 20 is rotated by using the electrostatic lenses 212, 214, 216 in such a way that the focus of an electron beam (the whole multiple beams 20) is dynamically adjusted in accordance with the height of the surface of the target object 101 measured, the magnification of the beam image is maintained constant, and the position displacement amount measured in the rotation direction of the XY stage 105 is corrected and the pattern generator 150 writes a pattern of the beam image on the target object 101 above the XY stage 105 while the beam image being rotated.

Figure 19A:
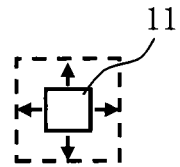
FIGS. 19A and 19B are conceptual diagrams for explaining another example of the effect of the 3-stage electrostatic lenses in Embodiment 3.
Figure 19B:
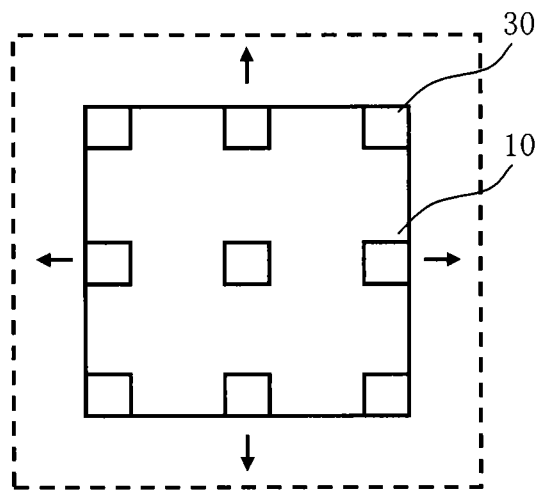

FIGS. 19A and 19B are conceptual diagrams for explaining another example of the effect of the 3-stage electrostatic lenses in Embodiment 3. In a single beam system, as shown in FIG. 19A, the irradiation area is the shot figure 11 of one beam and the position error is small even if magnification variations arise. In a multi-beam system, by contrast, as shown in FIG. 19B, a large number of the shot figures 36 by a large number of beams are irradiated by one shot and the irradiation area 10 is large. Thus, if magnification variations arise, the magnification of the whole irradiation area 10 varies and thus, if the same magnification variations as those in the single beam system arise, the position displacement amount of each of the shot figures 36 increases. Therefore, magnification variations of an image are canceled out by arranging 3-stage electrostatic lenses as in Embodiment 3 so that such a position displacement can be suppressed. Particularly in a multi-beam system, the effect thereof is significant.

According to Embodiment 3, as described above, a pattern can be written to a desired position while performing dynamic focusing and maintaining the magnification of a beam image constant even if the rotational position of the stage is displaced. Therefore, a pattern can be written with still higher precision.

Figure 20:
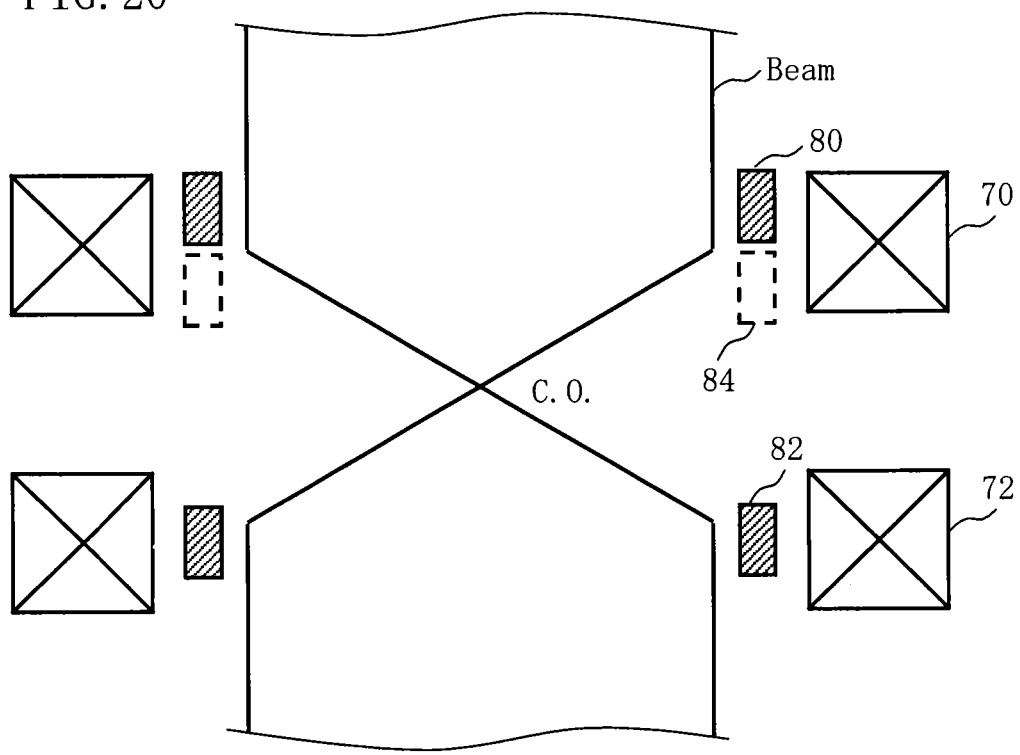
FIG. 20 is a diagram showing the arrangement relationship between the electromagnetic lens and the electrostatic lens.

FIG. 20 is a diagram showing the arrangement relationship between the electromagnetic lens and the electrostatic lens. In each of the above embodiments, the reducing lens 205 and the objective lens 207 are shown as a set of electromagnetic lenses, but a set of electromagnetic lenses is not limited to such an example. A set of electromagnetic lenses 70, 72 only needs to be arranged inside an optical system through which an electron beam passes and magnetic fields thereof are in opposite directions. The control of the same content as described above can be exercised by arranging a total of two stages of electrostatic lenses 80, 82, one stage in each magnetic field of the electromagnetic lenses 70, 72 whose magnetic fields are in opposite directions or a total of three stages of electrostatic lenses 80, 82, 84, two stages in one magnetic field and one stage in the other.

In the foregoing, the embodiments have been described with reference to concrete examples. However, the present invention is not limited to such concrete examples. The raster scan operation described above is only an example and a raster scan operation using a multiple beams or other operations methods may also be used. In the examples described above, the multi-beam writing apparatus is shown, but the writing apparatus is not limited to the multi-beam writing apparatus and a writing apparatus of a single beam may also be used if a set of electromagnetic lenses whose magnetic fields are in opposite directions is arranged therein. A similar effect can be achieved.

Parts of the apparatus configuration, the control method, and the like which are not needed to be explained directly for the explanation of the present invention are not described. However, a necessary apparatus configuration and a necessary control method can be appropriately selected and used. For example, a control unit configuration which controls the writing apparatus 100 is not described. However, a necessary control unit configuration is appropriately selected and used, as a matter of course.

In addition, all charged particle beam writing apparatuses and charged particle beam pattern writing methods which include the elements of the present invention and can be attained by appropriately changing in design by a person skilled in the art are included in the spirit and scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam pattern writing method comprising:
    placing a target object above a stage;
    measuring a position displacement amount of the stage in a rotation direction;
    arranging at least one of a plurality of electrostatic lenses in a magnetic field of each of a plurality of electromagnetic lenses;
    arranging adjacent electromagnetic lenses in the plurality of electromagnetic lenses to have magnetic fields oriented in opposite directions;
    writing a pattern of a beam image on the target object above the stage while the beam image is rotated using the plurality of electrostatic lenses;
    storing a correlation table in a storage device, the correlation table storing, for each of a plurality of rotation angles of the beam image, a set of voltages to be applied to each of the plurality of electrostatic lenses to correct for a correlated rotation angle without changing a focus position of a charged particle beam;
    acquiring, from the stored correlation table, a set of voltages to be applied to each of the plurality of electrostatic lenses that correlates to the measured position displacement amount in the rotation direction; and
    applying the set of voltages acquired from the stored correlation table to each of the plurality of electrostatic lenses to correct the position displacement amount measured in the rotation direction of the stage while simultaneously maintaining an unchanged focus position of the charged particle beam passing through the plurality of electromagnetic lenses.

2. The method according to claim 1, wherein
    the plurality of electrostatic lenses includes at least three electrostatic lenses, at least two stages of the electrostatic lenses are arranged in the magnetic field of one of the plurality of electromagnetic lenses, at least one stage of the electromagnetic lens is arranged in the magnetic field of another one of the plurality of electromagnetic lenses, and
    at least three stages of the electromagnetic lenses, including the at least two stages of the electrostatic lenses and the at least one stage of the electromagnetic lens, are configured to rotate the beam image to avoid the focus displacement of the charged particle beam passing through the plurality of electromagnetic lenses, to maintain a magnification of the beam image constant, and to correct the position displacement amount measured, in the rotation direction of the stage.

3. The method according to claim 1, further comprising:
    measuring a surface height of the target object above the stage,
    wherein when the beam image is rotated, the beam image is rotated by using the plurality of electrostatic lenses to adjust a focus of the charged particle beam dynamically in accordance with the surface height of the target object measured and to correct the position displacement amount measured, in the rotation direction of the stage.

4. The method according to claim 3, wherein
    the plurality of electrostatic lenses includes at least three electrostatic lenses, at least two stages of the electrostatic lenses are arranged in the magnetic field of one of the plurality of electromagnetic lenses, at least one stage of the electromagnetic lens is arranged in the magnetic field of another one of the plurality of electromagnetic lenses, and
    at least three stages of the electromagnetic lenses, including the at least two stages of the electrostatic lenses and the at least one stage of the electromagnetic lens, are configured to rotate the beam image to adjust the focus of the charged particle beam dynamically in accordance with the surface height of the target object measured, to maintain a magnification of the beam image constant, and to correct the position displacement amount measured, in the rotation direction of the stage.

5. The method according to claim 1, wherein the charged particle beam passing through the plurality of electromagnetic lenses includes multiple beams.

6. The method according to claim 5, wherein a beam image by the whole multiple beams is rotated by the plurality of electrostatic lenses to avoid a focus displacement of each beam of the multiple beams passing through the plurality of electromagnetic lenses and to correct the position displacement amount measured, in the rotation direction of the stage.

7. The method according to claim 5, wherein
    the plurality of electrostatic lenses includes at least three electrostatic lenses, at least two stages of the electrostatic lenses are arranged in the magnetic field of one of the plurality of electromagnetic lenses, at least one stage of the electromagnetic lens is arranged in the magnetic field of another one of the plurality of electromagnetic lenses and
    at least three stages of the electromagnetic lenses, including the at least two stages of the electrostatic lenses and the at least one stage of the electromagnetic lens, are configured to rotate the multiple beams to rotate the beam image to avoid the focus displacement of each beam of the multiple beams, to maintain a magnification of the beam image by the whole multiple beams constant, and to correct the position displacement amount measured, in the rotation direction of the stage.

8. A charged particle beam writing apparatus, comprising:
    a stage above which a target object is placed;
    a measuring unit configured to measure a position displacement amount of the stage in a rotation direction;
    a plurality of electromagnetic lenses with adjacent electromagnetic lenses in the plurality of electromagnetic lenses having magnetic fields in opposite directions;
    a plurality of electrostatic lenses at least one of which is arranged in a magnetic field of each of the electromagnetic lenses;
    a storage device configured to store a correlation table, the correlation table storing, for each of a plurality of rotation angles of the beam image, a set of voltages to be applied to each of the plurality of electrostatic lenses to correct for a correlated rotation angle without changing a focus position of a charged particle beam;
    a voltage acquisition unit that acquires, from the stored correlation table, a set of voltages to be applied to each of the plurality of electrostatic lenses that correlates to the measured position displacement amount in the rotation direction;
    a plurality of voltage application units configured to apply the acquired set of voltages to the plurality of electrostatic lenses to rotate a beam image to correct the position displacement amount measured in the rotation direction of the stage while simultaneously maintaining an unchanged focus position of a charged particle beam passing through the plurality of electromagnetic lenses; and
    writing a pattern of the beam image rotated by the set of voltages on a target object above the stage.

9. The apparatus according to claim 8, wherein
the plurality of electrostatic lenses includes at least three electrostatic lenses, at least two stages of the electrostatic lenses are arranged in the magnetic field of one of the plurality of electromagnetic lenses, at least one stage of the electromagnetic lens is arranged in the magnetic field of another one of the plurality of electromagnetic lenses, and
at least three stages of the electromagnetic lenses, including the at least two stages of the electrostatic lenses and the at least one stage of the electromagnetic lens, are configured to rotate the beam image to avoid the focus displacement of the charged particle beam passing through the plurality of electromagnetic lenses, to maintain a magnification of the beam image constant, and to correct the position displacement amount measured, in the rotation direction of the stage.

10. The apparatus according to claim 8, further comprising: a height measuring unit configured to measure a surface height of the target object above the stage,
wherein when the beam image is rotated, the beam image is rotated by using the plurality of electrostatic lenses to adjust a focus of the charged particle beam dynamically in accordance with the surface height of the target object measured and to correct the position displacement amount measured, in the rotation direction of the stage.

11. The apparatus according to claim 10, wherein the plurality of electrostatic lenses includes at least three electrostatic lenses, at least two stages of the electrostatic lenses are arranged in the magnetic field of one of the plurality of electromagnetic lenses, at least one stage of the electromagnetic lens is arranged in the magnetic field of another one of the plurality of electromagnetic lenses, and
at least three stages of the electromagnetic lenses, including the at least two stages of the electrostatic lenses and the at least one stage of the electromagnetic lens, are configured to rotate the beam image to adjust the focus of the charged particle beam dynamically in accordance with the surface height of the target object measured, to maintain a magnification of the beam image constant, and to correct the position displacement amount measured, in the rotation direction of the stage.

12. The apparatus according to claim 8, wherein the charged particle beam passing through the plurality of electromagnetic lenses is multiple beams.

13. The apparatus according to claim 12, wherein the plurality of electrostatic lenses are configured to rotate the multiple beams to rotate the beam image to avoid a focus displacement of each beam of the multiple beams passing through the plurality of electromagnetic lenses and to correct the position displacement amount measured, in the rotation direction of the stage.

14. The apparatus according to claim 12, wherein
the plurality of electrostatic lenses includes at least three electrostatic lenses, at least two stages of the electrostatic lenses are arranged in the magnetic field of one of the plurality of electromagnetic lenses, at least one stage of the electromagnetic lens is arranged in the magnetic field of another one of the plurality of electromagnetic lenses, and
at least three stages of the electromagnetic lenses, including the at least two stages of the electrostatic lenses and the at least one stage of the electromagnetic lens, are configured to rotate the multiple beams to rotate the beam image to avoid a focus displacement of each beam of the multiple beams, to maintain a magnification of the beam image by the whole multiple beams constant, and to correct the position displacement amount measured, in the rotation direction of the stage.

* * * * *